(12) United States Patent
Lee et al.

(10) Patent No.: US 12,150,263 B2
(45) Date of Patent: Nov. 19, 2024

(54) ELECTRONIC DEVICE INCLUDING METAL HOUSING

(71) Applicant: Samsung Electronics Co., Ltd., Suwon-si (KR)

(72) Inventors: Jongsu Lee, Suwon-si (KR); Yoonhee Lee, Suwon-si (KR); Kiseok Kwon, Suwon-si (KR); Sungho Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 17/701,064

(22) Filed: Mar. 22, 2022

(65) Prior Publication Data

US 2022/0312613 A1 Sep. 29, 2022

Related U.S. Application Data

(63) Continuation of application No. PCT/KR2022/003372, filed on Mar. 10, 2022.

(30) Foreign Application Priority Data

Mar. 23, 2021 (KR) .................. 10-2021-0037389

(51) Int. Cl.
*H05K 5/04* (2006.01)
*C25D 11/12* (2006.01)
(Continued)

(52) U.S. Cl.
CPC ............... *H05K 5/04* (2013.01); *C25D 11/12* (2013.01); *C25D 21/12* (2013.01); *H04B 1/3888* (2013.01); *Y10T 428/1259* (2015.01)

(58) Field of Classification Search
None
See application file for complete search history.

(56) References Cited

U.S. PATENT DOCUMENTS 7,717,271 B2 5/2010 Ramaswamy et al.
8,047,382 B2 11/2011 Ramaswamy et al.
(Continued)

FOREIGN PATENT DOCUMENTS

JP 2003-011099 A 1/2003
JP 2016-531208 A 10/2016
(Continued)

OTHER PUBLICATIONS

English machine translation of JP2003-011099, EPO, accessed Dec. 13, 2023.*

(Continued)

*Primary Examiner* — Xiaobei Wang
(74) *Attorney, Agent, or Firm* — Jefferson IP Law, LLP

(57) ABSTRACT

An electronic device is provided. The electronic device includes a housing that forms a portion of an outer surface of the electronic device and a display disposed in the housing and visually exposed through one side of the housing. The housing includes a first portion containing a metallic material, and the first portion includes a base material layer made of the metallic material, a first film layer that is disposed adjacent to a surface of the housing and that contains oxide of the metallic material, and a second film layer that is disposed between the base material layer and the first film layer and that contains oxide of the metallic material. The first film layer includes a first pore structure that extends in a direction substantially perpendicular to a surface of the first film layer, and the second film layer includes a second pore structure that is at least partially in fluid communication with the first pore structure and that extends in a radial shape toward the base material layer.

15 Claims, 15 Drawing Sheets

(51) Int. Cl.
*C25D 21/12* (2006.01)
*H04B 1/3888* (2015.01)

(56) References Cited

U.S. PATENT DOCUMENTS

| | | | |
|---|---|---|---|
| 9,051,658 B2 | 6/2015 | Tatebe et al. | |
| 9,487,879 B2 | 11/2016 | Tatebe et al. | |
| 9,512,536 B2 | 12/2016 | Tatebe et al. | |
| 9,854,694 B2 | 12/2017 | Kiple et al. | |
| 9,869,030 B2 | 1/2018 | Curran et al. | |
| 9,955,603 B2 | 4/2018 | Kiple et al. | |
| 10,034,402 B2 | 7/2018 | Kiple et al. | |
| 10,231,352 B2 | 3/2019 | Woodhull et al. | |
| 10,309,029 B2 | 6/2019 | Duffy et al. | |
| 10,760,175 B2 | 9/2020 | Tatebe et al. | |
| 10,781,529 B2 | 9/2020 | Tatebe et al. | |
| 10,844,506 B2 | 11/2020 | Nunomura | |
| 11,131,036 B2 | 9/2021 | Tatebe et al. | |
| 11,434,579 B2 | 9/2022 | Lee et al. | |
| 2007/0125701 A1 | 6/2007 | Ramaswamy et al. | |
| 2010/0155252 A1 | 6/2010 | Ramaswamy et al. | |
| 2013/0318766 A1* | 12/2013 | Kiple | H05K 5/02 29/428 |
| 2015/0090597 A1 | 4/2015 | Tatebe et al. | |
| 2015/0090598 A1 | 4/2015 | Tatebe et al. | |
| 2016/0060783 A1* | 3/2016 | Curran | C25D 11/04 205/175 |
| 2016/0312374 A1 | 10/2016 | Duffy et al. | |
| 2017/0044684 A1 | 2/2017 | Tatebe et al. | |
| 2017/0121836 A1 | 5/2017 | Tatebe et al. | |
| 2017/0121837 A1 | 5/2017 | Tatebe et al. | |
| 2017/0121838 A1 | 5/2017 | Tatebe et al. | |
| 2019/0161881 A1 | 5/2019 | Nunomura | |
| 2019/0226113 A1 | 7/2019 | Winn | |
| 2021/0095388 A1 | 4/2021 | Lee et al. | |

FOREIGN PATENT DOCUMENTS

| | | |
|---|---|---|
| JP | 2018-090897 A | 6/2018 |
| JP | 2019-094553 A | 6/2019 |
| KR | 10-2015-0017742 A | 2/2015 |
| KR | 10-2019-0084455 A | 7/2019 |
| WO | 01/18281 A1 | 3/2001 |

OTHER PUBLICATIONS

Scholarly Community Encyclopedia, "Anodizing", https://encyclopedia.pub/entry/6730, accessed Dec. 13, 2023.*
Aluminum Surface Treatment; Korean Aluminum Surface Treatment Industry cooperative (Aug. 1993), pp. 190-194.
International Search Report dated Jun. 27, 2022, issued in International Patent Application No. PCT/KR2022/003372.
European Search Report dated Oct. 1, 2024, issued in European Application No. 22775951.1.

* cited by examiner

ELECTRONIC DEVICE INCLUDING METAL HOUSING

CROSS-REFERENCE TO RELATED APPLICATION(S)

This application is a continuation application, claiming priority under § 365(c), of an International application No. PCT/KR2022/003372, filed on Mar. 10, 2022, which is based on and claims the benefit of a Korean patent application number 10-2021-0037389, filed on Mar. 23, 2021, in the Korean Intellectual Property Office, the disclosure of which is incorporated by reference herein in its entirety.

TECHNICAL FIELD

The disclosure relates to an electronic device including a metal housing.

BACKGROUND ART

A housing of an electronic device may contain a metallic material to secure a predetermined stiffness. Furthermore, the housing may be manufactured to have texture and gloss to provide aesthetics to a user. The texture and/or gloss may be provided by performing a physical polishing process or a chemical polishing process on the metallic base material.

When the metallic base material (e.g., aluminum (Al)) of which the housing of the electronic device is made is electrolytically anodized in an electrolytic solution through an anodizing process, an oxide film (e.g., aluminum oxide ($Al_2O_3$)) with excellent adhesion may be formed on a surface of the metallic base material by oxygen generated from an anode. The oxide film may improve the corrosion resistance and wear resistance of the housing and may improve the aesthetics of the appearance.

The above information is presented as background information only to assist with an understanding of the disclosure. No determination has been made, and no assertion is made, as to whether any of the above might be applicable as prior art with regard to the disclosure.

DISCLOSURE

Technical Problem

A method for making the metal housing included in at least a partial area of the exterior of the electronic device appear uniformly white may include a method for forming protrusions and depressions on the metal surface using a blasting method, an etching method, or a laser method, a method for forming an opaque white film using a special alloy, or a method for injecting metal salt causing a white color into the metal housing.

However, in the case of forming the protrusions and depressions on the metal surface, the color uniformity of the electronic device may be lowered due to a deviation in surface roughness, and a method for forming a non-uniform film on a surface using a laser may require additional equipment, which causes an increase in cost. Furthermore, in the case of the method for injecting the metal salt causing a white color into the metal housing, the metal housing may be formed in a color close to gray rather than white.

Aspects of the disclosure are to address at least the above-mentioned problems and/or disadvantages and to provide at least the advantages described below. Accordingly, an aspect of the disclosure is to provide an electronic device including a housing having a bright white color by stacking a plurality of oxide films and thereafter forming pores as radii in a film adjacent to metal among the plurality of oxide films.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing that forms a portion of an outer surface of the electronic device and a display disposed in the housing and visually exposed through one side of the housing. The housing includes a first portion containing a metallic material, and the first portion includes a base material layer made of the metallic material, a first film layer that is disposed adjacent to a surface of the housing and that contains oxide of the metallic material, and a second film layer that is disposed between the base material layer and the first film layer and that contains oxide of the metallic material. The first film layer includes a first pore structure that extends in a direction substantially perpendicular to a surface of the first film layer. The second film layer includes a second pore structure that is at least partially in fluid communication with the first pore structure, and the second pore structure configured to extend as radii from the first pore structure toward the base material layer.

In accordance with another aspect of the disclosure, an electronic device is provided. The electronic device includes a housing including a front plate, a back plate that faces away from the front plate, and a side member that surrounds an inner space between the front plate and the back plate and a display disposed in the inner space and visually exposed through the front plate. The side member includes a first portion containing a metallic material, and the first portion includes a base material layer made of the metallic material, a first film layer disposed adjacent to a surface of the side member and made of oxide of the metallic material, and a second film layer disposed between the base material layer and the first film layer and made of oxide of the metallic material. The first film layer includes a plurality of first pore structures that extend in a direction substantially perpendicular to a surface of the first film layer. The second film layer includes a second pore structure that is at least partially in fluid communication with the first pore structure, and the second pore structure configured to extend as radii from the first pore structure toward the base material layer.

In accordance with another aspect of the disclosure, a method for manufacturing a metal housing is provided. The method includes preparing a metallic base material, performing primary anodizing on the metallic base material in a predetermined electrolytic solution with a first voltage or a first current, and performing secondary anodizing on the metallic base material in the predetermined electrolytic solution with a second voltage or a second current less than the first voltage or the first current. In the primary anodizing operation, a first film layer including a plurality of first pore structures is formed on a surface of the metallic base material, and in the secondary anodizing operation, a second film layer including a plurality of second pore structures is formed between the surface of the metallic base material and the first film layer. The first pore structures and the second pore structures have different structures.

Advantageous Effects

According to the various embodiments of the disclosure, the metal portion of the housing of the electronic device may include the stacked structure of the first oxide film in which the first pore structure having a straight shape is formed and the second oxide film in which the second pore structure formed as radii. Accordingly, a uniform and bright white appearance may be implemented.

Furthermore, according to the various embodiments of the disclosure, the corrosion resistance and wear resistance of the housing may be secured by the first oxide film adjacent to the surface of the housing of the electronic device.

Moreover, according to the various embodiments of the disclosure, the stacked oxide film structure may be formed through the anodizing process of changing and applying the voltage or current in the same electrolytic solution. Accordingly, the manufacturing process of the housing of the electronic device may be simplified, and cost savings may be achieved.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
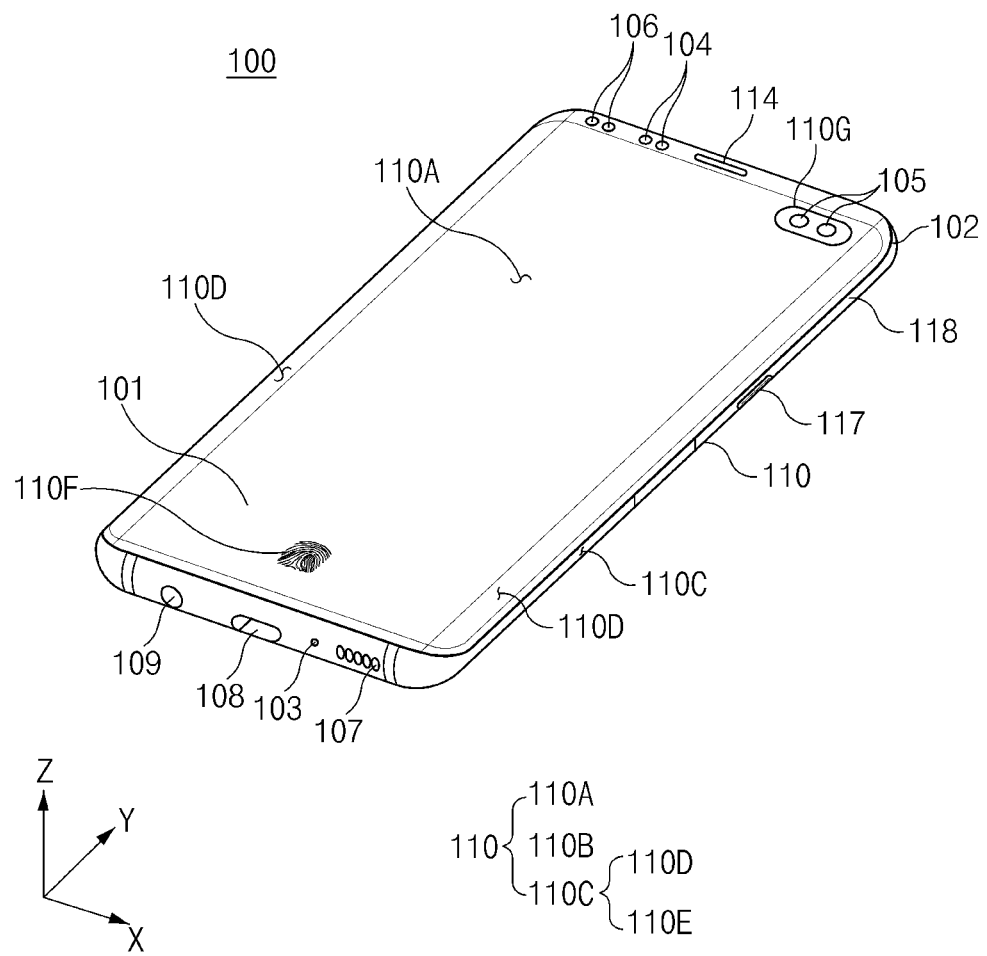
FIG. 1 is a front perspective view of an electronic device according to an embodiment of the disclosure.

FIG. 1 is a front perspective view of an electronic device according to an embodiment of the disclosure.

Figure 2:
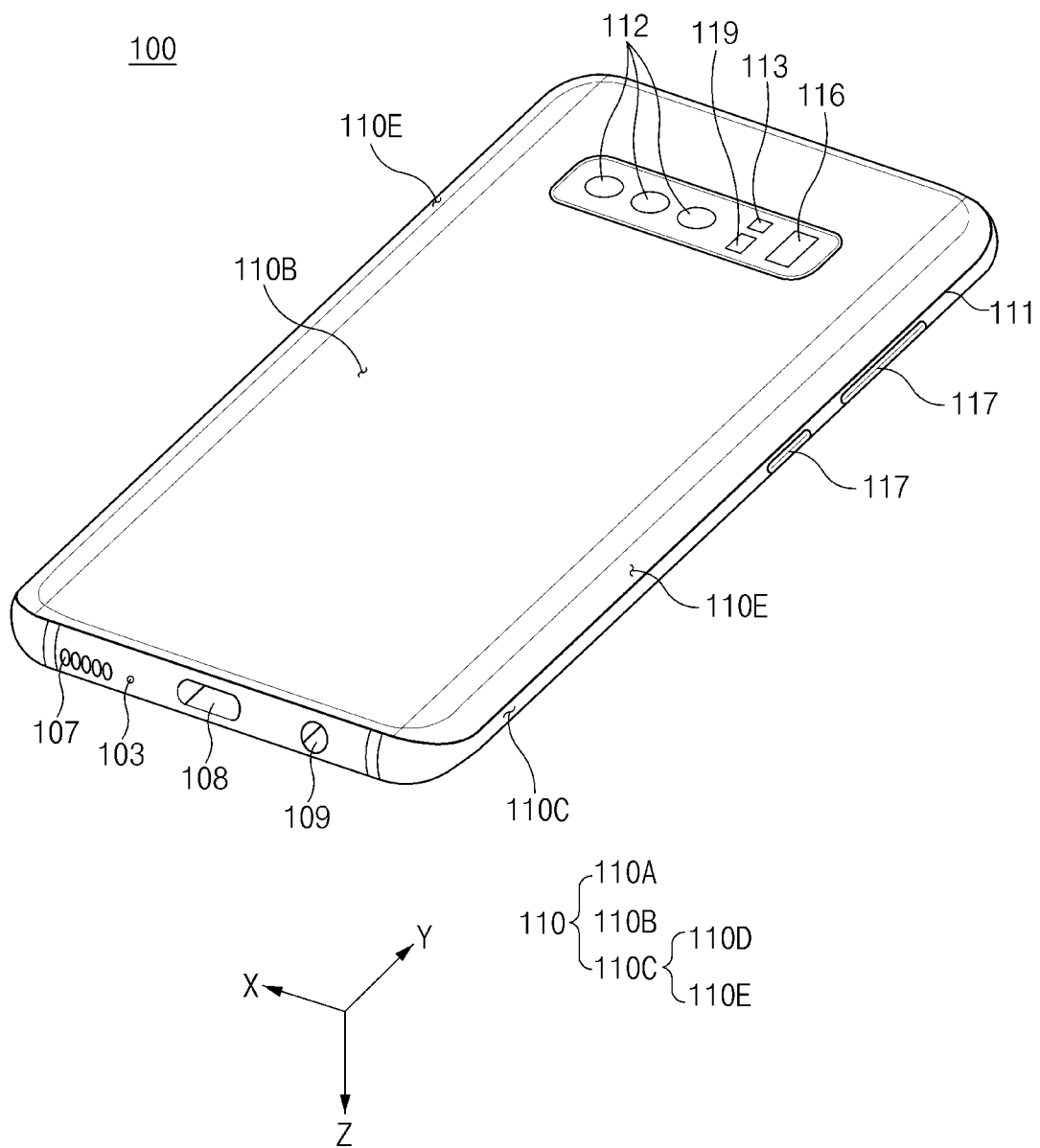
FIG. 2 is a rear perspective view of an electronic device according to an embodiment of the disclosure.

FIG. 2 is a rear perspective view of an electronic device according to an embodiment of the disclosure.

Referring to FIGS. 1 and 2, the electronic device 100 according to an embodiment may include a housing 110 that includes a first surface (or, a front surface) 110A, a second surface (or, a rear surface) 110B, and a third surface (or, a side surface) 110C surrounding a space between the first surface 110A and the second surface 110B. According to various embodiments of the disclosure, the housing 110 may refer to a structure that forms some of the first surface 110A, the second surface 110B, and the third surface 110C.

In an embodiment, the first surface 110A may be formed by a front plate 102, at least a portion of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, a polymer, metal (e.g., aluminum, stainless steel (STS), or magnesium), or a combination of at least two thereof. The third surface 110C may be formed by a side bezel structure (or, a "frame structure")

118 coupled with the front plate 102 and the back plate 111. For example, the side bezel structure 118 may contain metal and/or a polymer.

According to various embodiments of the disclosure, the back plate 111 and the side bezel structure 118 may be integrally formed with each other and may contain the same material (e.g., a metallic material such as aluminum).

In an embodiment (refer to FIG. 1), the front plate 102 may include two first areas 110D that curvedly and seamlessly extend from the first surface 110A toward the back plate 111. The first areas 110D may be located at opposite long edges of the front plate 102.

In an embodiment (refer to FIG. 2), the back plate 111 may include two second areas 110E that curvedly and seamlessly extend from the second surface 110B toward the front plate 102. The second areas 110E may be located at opposite long edges of the back plate 111.

According to various embodiments of the disclosure, the front plate 102 may include only one of the two first areas 110D, and the back plate 111 may include only one of the two second areas 110E. In various embodiments, the front plate 102 may not include the first areas 110D. Furthermore, the back plate 111 may not include the second areas 110E.

In the illustrated embodiment, when the electronic device 100 is viewed from one side, the side bezel structure 118 may have a first thickness (or, width) at sides (e.g., short sides or sides facing the y-axis direction) not including the first areas 110D or the second areas 110E and may have a second thickness at sides (e.g., long sides or sides facing the x-axis direction) including the first areas 110D or the second areas 110E, the second thickness being smaller than the first thickness.

According to an embodiment, the electronic device 100 may include at least one of a display 101, audio modules 103, 107, and 114, sensor modules 104, 116, and 119, camera devices 105, 112, and 113, key input devices 117, a light emitting element 106, and connector holes 108 and 109. According to various embodiments of the disclosure, the electronic device 100 may not include at least one component (e.g., the key input devices 117 or the light emitting element 106) among the aforementioned components, or may additionally include other component(s).

In an embodiment, the display 101 may be visually exposed outside the electronic device 100 through most of the front plate 102. For example, at least part of the display 101 may be visually exposed through the front plate 102 that includes the first surface 110A and the first areas 110D of the third surface 110C.

In an embodiment, the periphery of the display 101 may be formed to be substantially the same as the shape of the outside edge (e.g., the periphery) of the front plate 102. For example, the gap between the outside edge of the display 101 and the outside edge of the front plate 102 may be substantially constant to expand the area by which the display 101 is visually exposed.

In an embodiment, the surface of the housing 110 (or, the front plate 102) may include a screen display area that is formed as the display 101 is visually exposed. For example, the screen display area may include the first surface 110A and the first areas 110D of the third surface 110C.

In an embodiment, the screen display area 110A and 110D may include a sensing area 110F configured to obtain biometric information of a user. When the screen display area 110A and 110D includes the sensing area 110F, this may mean that at least part of the sensing area 110F overlaps the screen display area 110A and 110D. For example, the sensing area 110F may refer to an area capable of displaying visual information of the display 101 like the other areas of the screen display area 110A and 110D and additionally obtaining the user's biometric information (e.g., fingerprint).

In an embodiment, the screen display area 110A and 110D of the display 101 may include an area 110G through which the first camera device 105 (e.g., a punch hole camera) is visually exposed. For example, at least part of the periphery of the area 110G, through which the first camera device 105 is exposed, may be surrounded by the screen display area 110A and 110D. In various embodiments, the first camera device 105 may include a plurality of camera devices.

In various embodiments (not illustrated) of the disclosure, a recess or an opening may be formed in part of the screen display area 110A and 110D of the display 101. At least one of the audio module 114, the first sensor module 104, or the light emitting element 106 may be aligned with the recess or the opening.

In various embodiments (not illustrated) of the disclosure, at least one of the audio module 114, the sensor modules 104, 116, and 119, or the light emitting element 106 may be disposed on the rear surface of the screen display area 110A and 110D of the display 101.

In various embodiments (not illustrated) of the disclosure, the display 101 may be coupled with, or disposed adjacent to, touch detection circuitry, a pressure sensor capable of measuring the intensity (pressure) of a touch, and/or a digitizer that detects a stylus pen of a magnetic field type.

In various embodiments (not illustrated) of the disclosure, at least a part of the sensor modules 104, 116, and 119 and/or at least a part of the key input devices 117 may be disposed on the side surface (i.e., the third surface 110C) (e.g., the first areas 110D and/or the second areas 110E).

In an embodiment, the audio modules 103, 107, and 114 may include the microphone hole 103 and the speaker holes 107 and 114. A microphone for obtaining an external sound may be disposed in the microphone hole 103. According to various embodiments of the disclosure, a plurality of microphones may be disposed in the microphone hole 103 to sense the direction of a sound. The speaker holes 107 and 114 may include the external speaker hole 107 and the speaker hole 114 for telephone call. According to various embodiments of the disclosure, the speaker holes 107 and 114 and the microphone hole 103 may be implemented with a single hole, or a speaker (e.g., a piezoelectric speaker) may be included without the speaker holes 107 and 114.

In an embodiment, the sensor modules 104, 116, and 119 may generate an electrical signal or a data value that corresponds to an operational state inside the electronic device 100 or an environmental state external to the electronic device 100. For example, the sensor modules 104, 116, and 119 may include the first sensor module 104 (e.g., a proximity sensor) disposed on the first surface 110A of the housing 110, the second sensor module 116 (e.g., a (Time of Flight) TOF camera device) disposed on the second surface 110B of the housing 110, the third sensor module 119 (e.g., a hear rate monitor (HRM) sensor) disposed on the second surface 110B of the housing 110, and/or the fourth sensor module (e.g., a sensor 190 of FIG. 3) (e.g., a fingerprint sensor) coupled to the display 101. According to various embodiments of the disclosure, the fingerprint sensor may be disposed on the second surface 110B as well as the first surface 110A of the housing 110 (e.g., the screen display area 110A and 110D).

In an embodiment, the second sensor module 116 may include a TOF camera device for measuring a distance. At least part of the fourth sensor module (e.g., the sensor 190 of FIG. 3) may be disposed under the screen display area 110A and 110D. For example, the fourth sensor module may be disposed in a recess (e.g., a recess 139 of FIG. 3) that is formed on the rear surface of the display 101. That is, the fourth sensor module (e.g., the sensor 190 of FIG. 3) may not be exposed through the screen display area 110A and 110D and may form the sensing area 110F in at least part of the screen display area 110A and 110D.

According to various embodiments of the disclosure, the electronic device 100 may include a non-illustrated sensor module. For example, the sensor module may include at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

In an embodiment, the camera devices 105, 112, and 113 may include the first camera device 105 (e.g., a punch hole camera device) exposed on the first surface 110A of the electronic device 100, and the second camera device 112 and/or the flash 113 exposed on the second surface 110B of the electronic device 100.

In an embodiment, the first camera device 105 may be exposed through at least part of the screen display area 110D of the first surface 110A. For example, the first camera device 105 may be exposed on a partial area of the screen display area 110D through an opening (not illustrated) that is formed in part of the display 101.

In an embodiment, the second camera device 112 may include a plurality of camera devices (e.g., a dual camera or a triple camera). However, the second camera device 112 is not limited to including the plurality of camera devices and may include one camera device.

In an embodiment, the camera devices 105 and 112 may include one or more lenses, an image sensor, and/or an image signal processor. The flash 113 may include, for example, a light emitting diode or a xenon lamp. In some embodiments, two or more lenses (an infrared (IR) camera lens, a wide angle lens, and a telephoto lens) and image sensors may be disposed on one surface of the electronic device 100.

In an embodiment, the key input devices 117 may be disposed on the side surface (i.e., the third surface 110C) of the housing 110. According to various embodiments of the disclosure, the electronic device 100 may not include all or some of the aforementioned key input devices 117, and the key input devices 117 not included may be implemented in a different form, such as a soft key, on the display 101. In some embodiments, the key input devices may include a sensor module (e.g., the sensor 190 of FIG. 3) that forms the sensing area 110F included in the screen display area 110A and 110D.

In an embodiment, the light emitting element 106 may be disposed on the first surface 110A of the housing 110. The light emitting element 106 may provide state information of the electronic device 100 in the form of light. For example, the light emitting element 106 may provide a light source that operates in conjunction with the first camera device 105. According to various embodiments of the disclosure, the light emitting element 106 may include a light emitting diode (LED), an infrared light emitting diode (IR LED), and a xenon lamp.

In an embodiment, the connector holes 108 and 109 may include the first connector hole 108 capable of accommodating a connector (e.g., a USB connector) for transmitting and receiving power and/or data with an external electronic device, and/or the second connector hole 109 (e.g., an earphone jack) capable of accommodating a connector for transmitting and receiving audio signals with an external electronic device.

Figure 3:
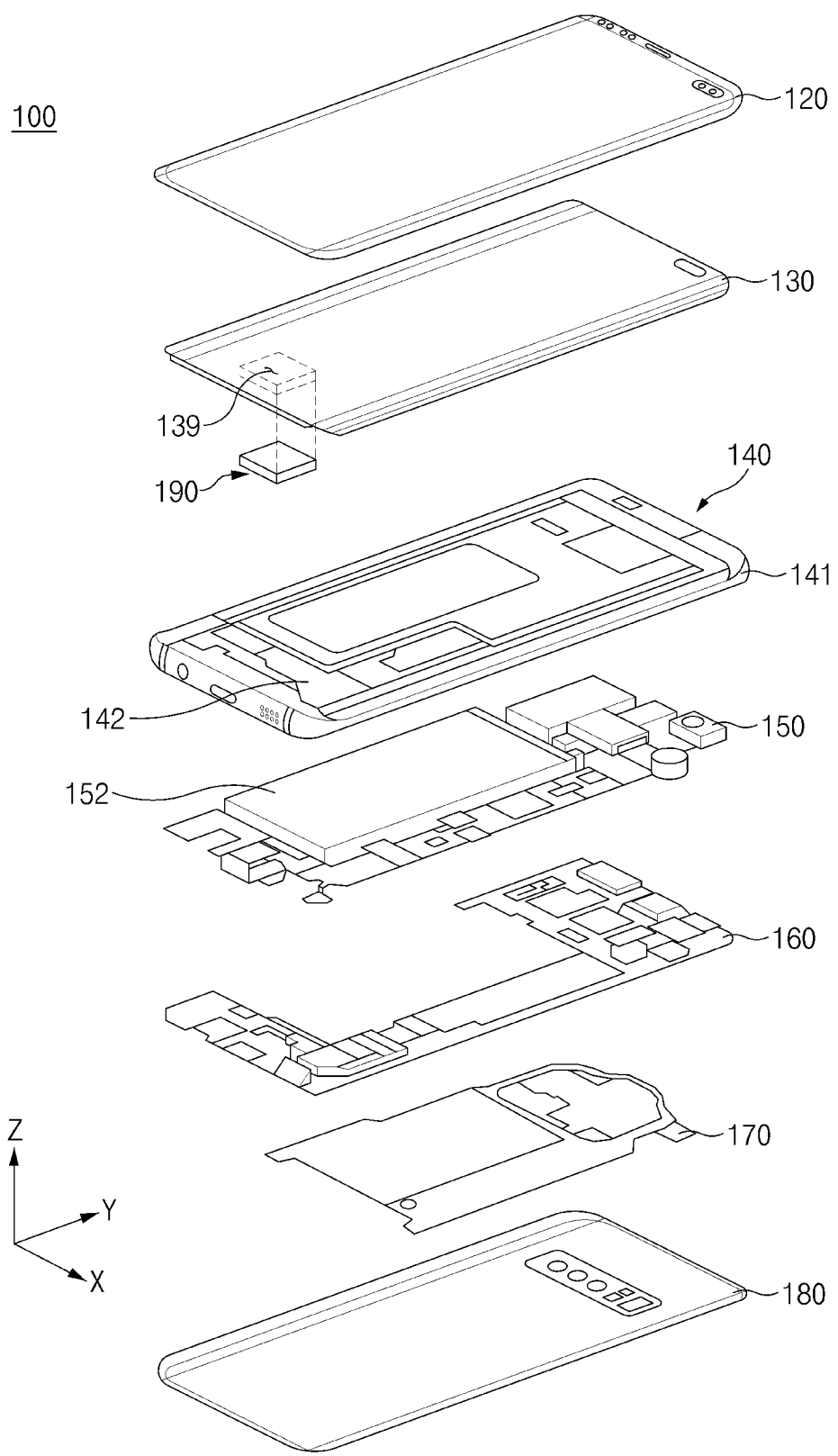
FIG. 3 is an exploded perspective view of an electronic device according to an embodiment of the disclosure.

FIG. 3 is an exploded perspective view of an electronic device according to an embodiment of the disclosure.

Referring to FIG. 3, the electronic device 100 according to an embodiment may include a front plate 120 (e.g., the front plate 102 of FIG. 1), a display 130 (e.g., the display 101 of FIG. 1), a side member 140 (e.g., the side bezel structure 118 of FIG. 1), a printed circuit board 150, a battery 152, a rear case 160, an antenna 170, and a back plate 180 (e.g., the back plate 111 of FIG. 2).

Some of the components of the electronic device 100 illustrated in FIG. 3 may be identical or similar to some of the components of the electronic device 100 illustrated in FIGS. 1 and 2. Hereinafter, repetitive descriptions will be omitted. According to various embodiments of the disclosure, the electronic device 100 may not include at least one component (e.g., a plate structure 142 or the rear case 160) among the aforementioned components, or may additionally include other component(s).

In an embodiment, the front plate 120, the back plate 180, and the side member 140 may form the exterior of the electronic device 100. For example, the housing (e.g., the housing 110 of FIGS. 1 and 2) of the electronic device 100 may be formed by a coupling structure of the front plate 120, the back plate 180, and the side member 140. The front plate 120 may form at least part of the front surface (e.g., the first surface 110A of FIG. 1) of the housing 110. The back plate 180 may form at least part of the rear surface (e.g., the second surface 110B of FIG. 2) of the housing 110. The side member 140 may form at least part of the side surface (e.g., the third surface 110C of FIGS. 1 and 2) of the housing 110.

In an embodiment, the side member 140 may include a frame structure 141 (e.g., a side bezel structure or a bracket) and the plate structure 142 (e.g., a support member). For example, the plate structure 142 may be connected or integrally formed with the frame structure 141 in the state of being disposed in the electronic device 100.

In an embodiment, the plate structure 142 may be formed of a metallic material and/or a nonmetallic (e.g., polymer) material. The display 130 may be coupled to one surface of the plate structure 142, and the printed circuit board 150 may be coupled to an opposite surface of the plate structure 142.

In an embodiment, a processor, a memory, and/or an interface may be mounted on the printed circuit board 150. The processor may include, for example, one or more of a central processing unit, an application processor, a graphic processing unit, an image signal processor, a sensor hub processor, or a communication processor. The memory may include, for example, a volatile memory or a nonvolatile memory.

The interface may include, for example, a high definition multimedia interface (HDMI), a universal serial bus (USB) interface, an SD card interface, and/or an audio interface. The interface may electrically or physically connect the electronic device 100 with an external electronic device and may include a USB connector, an SD card/multi media card (MMC) connector, or an audio connector.

In an embodiment, the battery 152 may supply power to at least one component of the electronic device 100. For example, the battery 152 may include a primary cell that is not rechargeable, a secondary cell that is rechargeable, or a fuel cell. At least part of the battery 152 may be disposed on substantially the same plane as the printed circuit board 150. The battery 152 may be integrally disposed inside the electronic device 100, or may be disposed so as to be detachable from the electronic device 100.

In an embodiment, the antenna 170 may be disposed between the back plate 180 and the battery 152. The antenna 170 may include, for example, a near field communication (NFC) antenna, a wireless charging antenna, and/or a magnetic secure transmission (MST) antenna. For example, the antenna 170 may perform short-range communication with an external device, or may wirelessly transmit and receive power required for charging.

Figure 4:
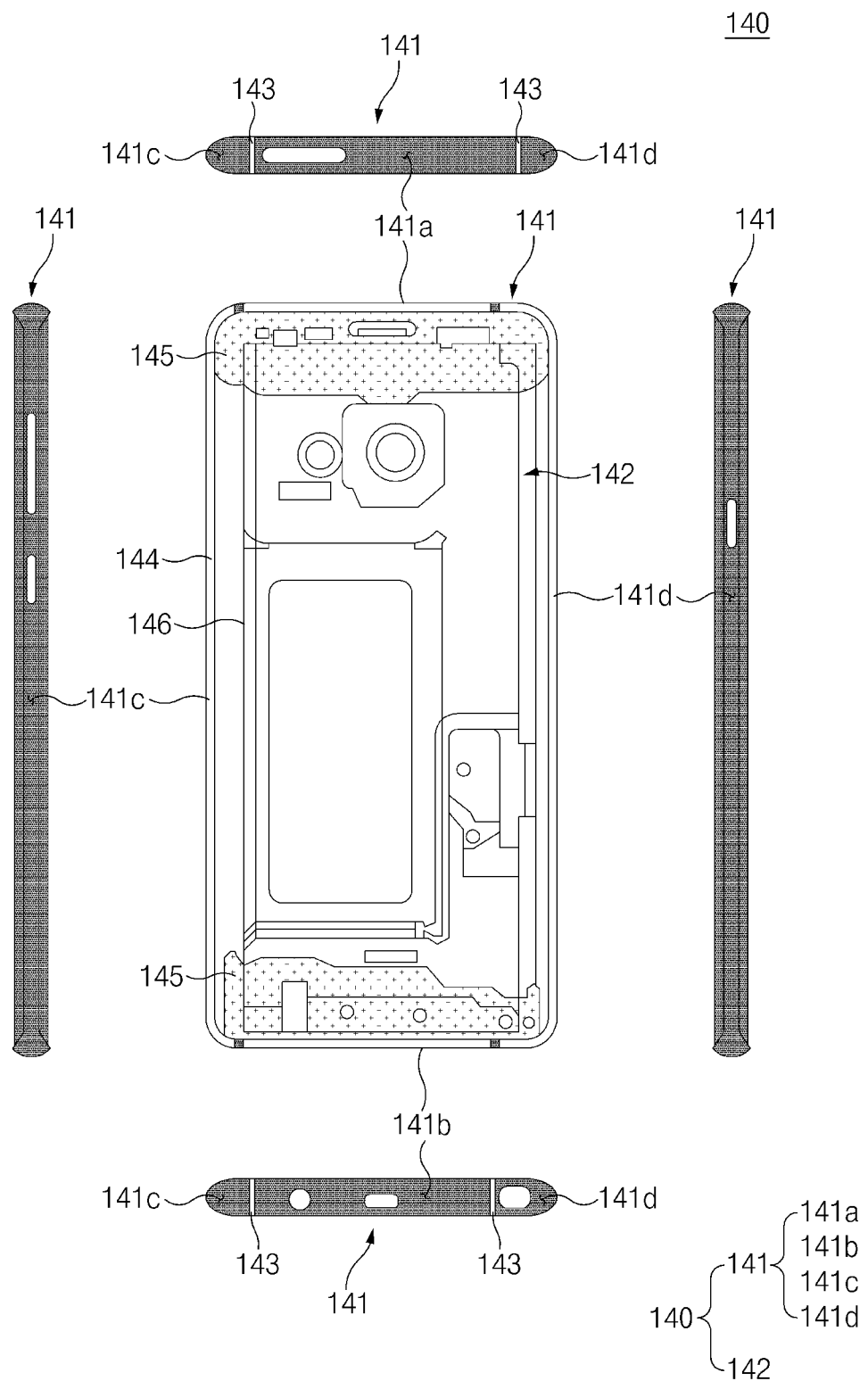
FIG. 4 is a view illustrating a side member of an electronic device according to an embodiment of the disclosure.

According to various embodiments of the disclosure, the electronic device 100 may be configured such that an antenna structure is formed by a portion of the frame structure 141 and/or a portion of the plate structure 142, or a combination thereof (e.g., refer to FIG. 4).

FIG. 4 is a view illustrating the side member of an electronic device according to an embodiment of the disclosure.

FIG. 4 illustrates a front view, a left side view, a right side view, a top view, and a bottom view of the side member.

Referring to FIG. 4, the side member 140 (e.g., the side member 140 of FIG. 3) of the electronic device according to an embodiment (e.g., the electronic device 100 of FIGS. 1 to 3) may include the frame structure 141 and the plate structure 142. The frame structure 141 may surround the periphery (or, the edges) of the plate structure 142.

In an embodiment, the frame structure 141 and the plate structure 142 may be integrally formed with each other, or may be formed to be separate parts and may be assembled together. The frame structure 141 may form the side surface of the electronic device 100 (e.g., the third surface 110C of the housing 110 of FIGS. 1 and 2). The plate structure 142 may form a space in which some of the other components of the electronic device 100 are disposed. For example, the plate structure 142 may provide a predetermined space in which a printed circuit board (e.g., the printed circuit board 150 of FIG. 3) or a display (e.g., the display 130 of FIG. 3) is disposed.

In an embodiment, one portion of the side member 140 may be formed of a metallic material, and another portion thereof may be formed of a nonmetallic material (e.g., a polymer material). For example, the side member 140 may include a metal portion (e.g., a first metal portion 144 and a second metal portion 146) that contains a predetermined metallic material and a polymer portion 145 that contains a predetermined polymer material. The frame structure 141 and the plate structure 142 may each include the metal portion 144 and 146 and the polymer portion 145. The frame structure 141 may include the first metal portion 144 and the polymer portion 145, and the plate structure 142 may include the second metal portion 146 and the polymer portion 145. For example, one portion of the frame structure 141 may be formed by the first metal portion 144, and the remaining portion thereof may be formed by the polymer portion 145. Furthermore, one portion of the plate structure 142 may be formed by the second metal portion 146, and the remaining portion thereof may be formed by the polymer portion 145.

In an embodiment, the frame structure 141 and the plate structure 142 may be implemented by using the same metal. For example, the first metal portion 144 and the second metal portion 146 may contain the same metallic material. However, the material of the side member 140 is not limited to the above-described contents, and according to various embodiments of the disclosure, the frame structure 141 and the plate structure 142 may be implemented by using different types of metals. For example, the first metal portion 144 may contain a first metallic material, and the second metal portion 146 may contain a second metallic material different from the first metallic material.

In various embodiments, when the first metal portion 144 and the second metal portion 146 are manufactured of the same metallic material, the first metal portion 144 and the second metal portion 146 may be integrally manufactured through a process of machining (e.g., Computer Numerical Control (CNC) machining) one metallic base material (or, metal plate), or may be manufactured through a process of machining a first metallic base material and a second metallic base material made of the same metallic material in the shape of the first metal portion 144 and the shape of the second metal portion 146 and coupling (or, bonding) the first metallic base material and the second metallic base material.

In various embodiments, when the first metal portion 144 and the second metal portion 146 are manufactured of different metallic materials, the first metal portion 144 and the second metal portion 146 may be manufactured through a process of forming the first metal portion 144 by machining a base material made of the first metallic material, forming the second metal portion 146 by machining a base material made of the second metallic material, and coupling the first metal portion 144 and the second metal portion 146.

In an embodiment, the frame structure 141 may include a plurality of cut-off portions 143 at least partially insulating the first metal portion 144. The plurality of cut-off portions 143 may be formed by the polymer portion 145. For example, the plurality of cut-off portions 143 may segment the first metal portion 144 into a metal portion 1-1 141*a*, a metal portion 1-2 141*b* facing the metal portion 1-1 141*a*, a metal portion 1-3 141*c* connecting one end of the metal portion 1-1 141*a* and one end of the metal portion 1-2 141*b*, and a metal portion 1-4 141*d* facing the metal portion 1-3 141*c*. The side surface of the electronic device 100 may be formed by the metal portion 1-1 141*a*, the metal portion 1-2 141*b*, the metal portion 1-3 141*c*, the metal portion 1-4 141*d*, and the cut-off portions 143 of the frame structure 141.

In an embodiment, the metal portion 1-1 141*a*, the metal portion 1-2 141*b*, the metal portion 1-3 141*c*, and the metal portion 1-4 141*d* may be electrically insulated from each other as the first metal portion 144 is segmented by the cut-off portions 143. At least part of the first metal portion 144 insulated by the cut-off portions 143 may form an antenna structure of the electronic device 100. For example, at least one of the metal portion 1-1 141*a* or the metal portion 1-2 141*b* may form an antenna structure by electrical connection with the printed circuit board (e.g., the printed circuit board 150 of FIG. 3) or a communication module (not illustrated) disposed on the printed circuit board 150. At least one of the metal portion 1-1 141*a* or the metal portion 1-2 141*b* may be used as an antenna radiator or an antenna ground.

In an embodiment, the first metal portion 144 of the frame structure 141 and the second metal portion of the plate structure 142 may each be configured to include an oxide film layer (e.g., a first film layer 230 and a second film layer 240 of FIG. 5 or a first film layer 320 and a second film layer 330 of FIGS. 6A to 6E) through an anodizing process. For example, the first metal portion 144 of the frame structure 141, which forms the exterior (or, the surface) of the electronic device 100, may be anodized to improve the corrosion resistance and wear resistance and implement an appealing appearance.

According to various embodiments of the disclosure, the side member 140 may be configured such that both the first metal portion 144 of the frame structure 141 and the second metal portion 146 of the plate structure 142 include an oxide film layer, or may be configured such that only the first metal portion 144 includes an oxide film layer and the second metal portion 146 does not include an oxide film layer. For example, the side member 140 may be formed such that only the first metal portion 144 includes an oxide film layer by anodizing the first metal portion 144 of the frame structure 141 that forms the exterior of the electronic device 100.

Figure 5:
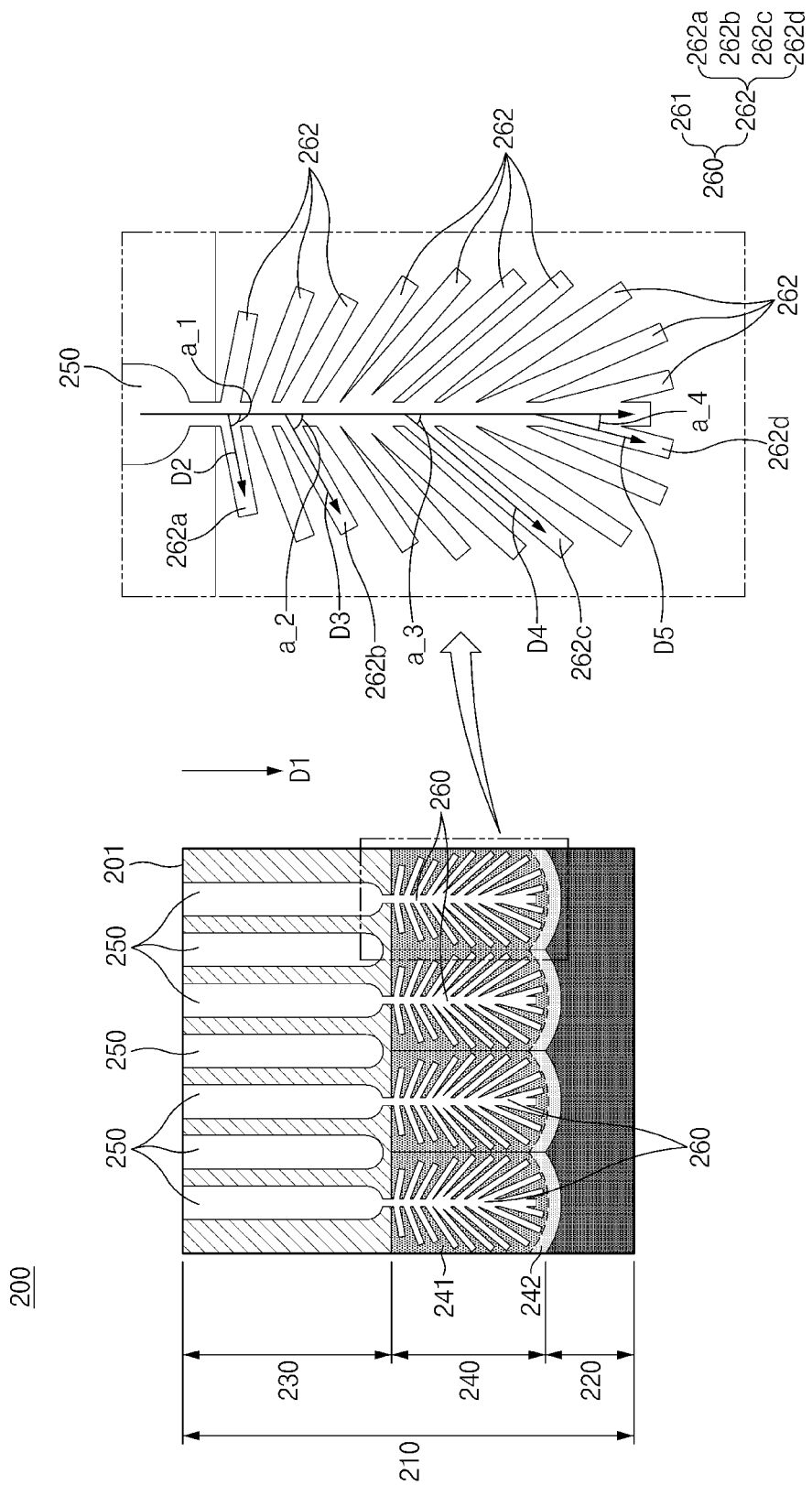
FIG. 5 is a sectional view illustrating a stacked structure of a housing of an electronic device according to an embodiment of the disclosure.

FIG. 5 is a sectional view illustrating a stacked structure of a housing of an electronic device according to an embodiment of the disclosure.

FIG. 5 is a schematic diagram illustrating a section of the housing to describe a stacked structure of a metal portion of the housing.

Referring to FIG. 5, the housing 200 (e.g., the housing 110 of FIGS. 1 and 2 or the side member 140 of FIGS. 3 and 4) of the electronic device 100 according to an embodiment may be a metal housing, at least part of which is formed of a metallic material. For example, the housing 200 may include a first portion 210 (e.g., the first metal portion 144 of the frame structure 141 of FIG. 4 or the second metal portion 146 of the plate structure 142 of FIG. 4) that contains a metallic material. The first portion 210 of the housing 200 may be formed by machining a metallic base material (or, a metal plate).

Although not illustrated, according to various embodiments of the disclosure, the housing 200 may include the first portion 210 made of a metallic material and a second portion (not illustrated) made of a nonmetallic material. For example, the second portion may be construed as indicating the remaining portion of the housing 200 other than the first portion 210. The second portion may be a polymer portion made of a polymer material. For example, the first portion 210 of the housing 200 may be referred to as the first metal portion (e.g., the first metal portion 144 of FIG. 4) or the second metal portion (e.g., the second metal portion 146 of FIG. 4) of the side member illustrated in FIG. 4 (e.g., the side member 140 of FIG. 4), and the second portion (not illustrated) of the housing 200 may be referred to as the cut-off portions (e.g., the cut-off portions 143 of FIG. 4) or the polymer portion (e.g., the polymer portion 145 of FIG. 4) of the side member 140.

In an embodiment, the first portion 210 may include oxide layers (e.g., the first film layer 230 and the second film layer 240) formed through an anodizing process of the metallic base material.

In an embodiment, the first portion 210 of the housing 200 may include a base material layer 220 (e.g., a substrate layer), the first film layer 230, and the second film layer 240. The first film layer 230 and the second film layer 240 may be formed on a surface of the base material layer 220 by oxidation of an area adjacent to a surface of the first portion 210 through an anodizing process. The base material layer 220 may refer to the remaining portion of the first portion 210 other than the first film layer 230 and the second film layer 240.

In an embodiment, the base material layer 220, which occupies most of the first portion 210, may refer to the metal base material that forms the first portion 210 of the housing 200. The base material layer 220 may contain a metallic material capable of forming an oxide film through anodizing. For example, the metallic material may include at least one of aluminum (Al), magnesium (Mg), or titanium (Ti). However, the metallic material is not limited to the above-described contents and may further include different types of metals according to various embodiments of the disclosure. For example, the metallic material may be an aluminum alloy containing aluminum (Al) having a purity of about 90% or more and may contain at least some of manganese (Mn), silicon (Si), iron (Fe), and magnesium (Mg).

In an embodiment, metal oxide in which the first film layer 230 and the second film layer 240 are included may be determined depending on a metallic material contained in the base material layer 220. For example, when the base material layer 220 is formed of aluminum (Al), the first film layer 230 and the second film layer 240 may be aluminum oxide layers containing aluminum oxide (e.g., $Al_2O_3$). Alternatively, when the base material layer 220 is formed of titanium (Ti), the first film layer 230 and the second film layer 240 may be titanium oxide layers containing titanium oxide (e.g., $TiO_2$).

In an embodiment, the first film layer 230 and the second film layer 240 may be oxide films made of oxide of a metallic material. Each of the first film layer 230 and the second film layer 240 may be formed in a porous structure including a plurality of pores (e.g., fine holes). The first film layer 230 and the second film layer 240 may be made of the same metal oxide. However, pores formed in the first film layer 230 and pores formed in the second film layer 240 may have different structures by making working conditions in an anodizing process different from each other (e.g., refer to a manufacturing method 400 of FIG. 7).

In an embodiment, the first film layer 230 may be disposed adjacent to a surface 201 of the housing 200 (or, the first portion 210) (e.g., the third surface 110C of the housing 110 of FIGS. 1 and 2). For example, the surface 201 of the first portion 210 may refer to a surface (e.g., the third surface 110C of FIGS. 1 and 2) that forms part of the exterior of the housing 200 (e.g., the housing 110 of FIGS. 1 and 2). According to the illustrated embodiment, a surface of the first film layer 230 may form the surface 201 of the first portion 210 as the first film layer 230 is disposed at the top of the first portion 210. However, this is illustrative, and the disclosure is not limited to the illustrated embodiment. According to various embodiments of the disclosure, another coating layer (e.g., a deposited layer (not illustrated) or an anti-contamination layer (not illustrated)) may be additionally disposed on the surface of the first film layer 230. In this case, the added coating layer may form the surface 201 of the first portion 210.

In an embodiment, the first film layer 230 may include a plurality of first pore structures 250 formed in at least part of the first film layer 230. The plurality of first pore structures 250 may extend in a direction substantially perpendicular to the surface of the first film layer 230. For example, the plurality of first pore structures 250 may extend from at least a partial area of the surface of the first film layer 230 to a surface of the second film layer 240 in a first direction D1 perpendicular to the surface of the first film layer 230 (or, the surface 201 of the first portion 210). The plurality of first pore structures 250 may be spaced apart from each other at predetermined intervals in a direction perpendicular to the first direction D1 inside the first film layer 230.

In an embodiment, the second film layer 240 may be disposed between the base material layer 220 and the first film layer 230. For example, the second film layer 240 may be disposed adjacent to the base material layer 220, and the first film layer 230 may form the surface of the first portion 210, or may be disposed adjacent to the surface of the first portion 210.

In an embodiment, the second film layer 240 may include a porous layer 241 having a plurality of second pore structures 260 formed therein and a barrier layer 242 disposed between the porous layer 241 and the base material layer 220. For example, the barrier layer 242 may be formed by contact between metal ions and oxygen ions when the metal base material is anodized, and the porous layer 241 formed by volume expansion may be located on the barrier layer 242. In the illustrated embodiment, the barrier layer 242 may be formed in an arc shape. However, without being necessarily limited thereto, the barrier layer 242 may be formed in various shapes.

In an embodiment, the second film layer 240 may include the plurality of second pore structures 260 formed in at least part of the porous layer 241. The plurality of second pore structures 260 may extend as radii toward the base material layer 220 and may be at least partially fluidly connected with the plurality of first pore structures 250. For example, the plurality of second pore structures 260 may extend from at least parts of the plurality of first pore structures 250.

In an embodiment, the plurality of second pore structures 260 may be formed in a shape extending from at least part of the border between the first film layer 230 and the second film layer 240 toward the base material layer 220 in various directions. For example, each of the plurality of second pore structures 260 may include a plurality of pores (e.g., a vertical pore 261 and inclined pores 262) that form a branched structure. Some of the plurality of pores may obliquely extend to form predetermined angles with the surface of the second film layer 240 (or, the surface of the first portion 210). Furthermore, the other pores may extend in the direction substantially perpendicular to the surface of the second film layer 240 (or, the surface of the first portion 210).

In an embodiment, the plurality of second pore structures 260 may include the vertical pore 261 extending from at least part of the surface of the second film layer 240 in the first direction D1 and the plurality of inclined pores 262 extending in a direction that forms a predetermined range of angle with the first direction D1. The vertical pore 261 may extend a part of the plurality of first pore structures 250 in the first direction D1. The plurality of inclined pores 262 may extend from at least partial areas of the vertical pore 261 in a plurality of directions different from the first direction D1. For example, at least a part of the plurality of inclined pores 262 may form a predetermined included angle with the vertical pore 261, and the included angle may be 90 degrees or less.

In an embodiment, the plurality of inclined pores 262 may diverge from the vertical pore 261 in different directions. For example, the first inclined pore 262a may extend in a second direction D2 that forms a first included angle a_1 with the first direction D1. The second inclined pore 262b may extend in a third direction D3 that forms a second included angle a_2 with the first direction D1. The third inclined pore 262c may extend in a fourth direction D4 that forms a third included angle a_3 with the first direction D1. The fourth inclined pore 262d may extend in a fifth direction D5 that forms a fourth included angle a_4 with the first direction D1.

In an embodiment, the first inclined pore 262a to the fourth inclined pore 262d are examples of the plurality of inclined pores 262 for explanation of the extension directions of the plurality of inclined pores 262, and the plurality of inclined pores 262 are not limited to including only the first inclined pore 262a to the fourth inclined pore 262d. The plurality of directions D2, D3, D3, and D5 in which the plurality of inclined pores 262 extend may form a predetermined range of included angle with the first direction D1. For example, the included angle may have a range of more than 0 degrees and less than or equal to 90 degrees (e.g., $(a\_1, a\_2, a\_3, a\_4, \ldots, a\_n) \leq) \leq 90°$. The included angle may be greater than 0 degrees because the plurality of directions D2, D3, D4, and D5 and the first direction D1 are different directions not overlapping each other.

According to the illustrated embodiment, each of the plurality of second pore structure 260 may be formed in a shape in which the plurality of inclined pores 262 are symmetric to each other with respect to the vertical pore 261. For example, the plurality of inclined pores 262 may be formed such that on the section of the first portion 210, the inclined pores 262 located on the left side of the vertical pore 261 and the inclined pores 262 located on the right side of the vertical pore 261 have substantially the same shape, number, and/or slope (e.g., included angle). However, FIG. 5 is a schematic diagram illustrating one example, and the shapes of the plurality of second pore structures 260 are not limited to the illustrated example. According to various embodiments of the disclosure, the plurality of inclined pores 262 may not be symmetric to each other with respect to the vertical pore 261 and may be irregularly formed in different directions and/or shapes (e.g., refer to FIGS. 6A to 6E).

In the illustrated embodiment, the first portion 210 may include an oxide film structure including the stacked structure of the first film layer 230 and the second film layer 240. However, the structure of the first portion 210 is not limited to the illustrated embodiment, and the oxide film structure may further include one or more oxide film layers in addition to the first film layer 230 and the second film layer 240. For example, the first portion 210 may further include a third film layer (not illustrated) disposed between the second film layer 240 and the base material layer 220 and may further include a fourth film layer (not illustrated) disposed between the third film layer (not illustrated) and the base material layer 220. According to various embodiments of the disclosure, when one or more oxide film layers (e.g., the third film layer or the fourth film layer) are additionally disposed between the second film layer 240 and the base material layer 220, the additionally disposed oxide film layers (not illustrated) may include a plurality of different pore structures (not illustrated) extending from the plurality of second pore structures 260.

The housing 200 according to an embodiment may be configured such that through an anodizing process, the first portion 210 of the housing 200 includes the base material layer 220, the second film layer 240 formed on the surface of the base material layer 220, and the first film layer 230 formed on the surface of the second film layer 240. The first film layer 230 and the second film layer 240 may be anodic oxide films formed by anodizing.

According to an embodiment, the first film layer 230 may be located adjacent to the surface of the first portion 210 or may form the surface of the first portion 210, and thus the reliability (e.g., wear resistance or chemical resistance) of the housing 200 may be secured. Furthermore, the plurality of second pore structures 260 formed as radii in the second film layer 240 may increase scattering of light incident on the housing 200. For example, an interface making contact with light may increase as the plurality of second pore structures 260 are formed as radii. The electronic device 100 may implement a uniform and bright white appearance by increasing scattering of light through the housing 200 (or, the first portion 210) including the second film layer 240.

In an embodiment, the first portion 210 of the housing 200 illustrated in FIG. 5 may be referred to as a portion (e.g., the first metal portion 144 or the second metal portion 146 of FIG. 4) of the side member (e.g., the side member 140 of FIG. 4). The first portion 210 of FIG. 5 may be included in at least one of the frame structure (e.g., the frame structure 141 of FIG. 4) or the plate structure (e.g., the plate structure 142 of FIG. 4) of the side member 140.

For example, through anodizing, a portion (e.g., the first metal portion 144 of FIG. 4) of the frame structure 141 and a portion (e.g., the second metal portion 146 of FIG. 4) of the plate structure 142 may be formed to be the first portion 210 having the stacked structure of FIG. 5, or only a portion (e.g., the first metal portion 144) of the frame structure 141 that forms the exterior of the electronic device 100 may be formed to be the first portion 210. However, the first portion 210 is not limited to being included in only the side member 140. According to various embodiments of the disclosure, the first portion 210 may be included in at least part of the back plate (e.g., the back plate 180 of FIG. 3) and/or the front plate (e.g., the front plate 120 of FIG. 3). For example, at least a portion of the back plate 180 or the front plate 120 may be formed of a metallic material, and through anodizing, the metal portion may be formed to be the first portion 210 having the stacked structure of FIG. 5.

Figure 6A:
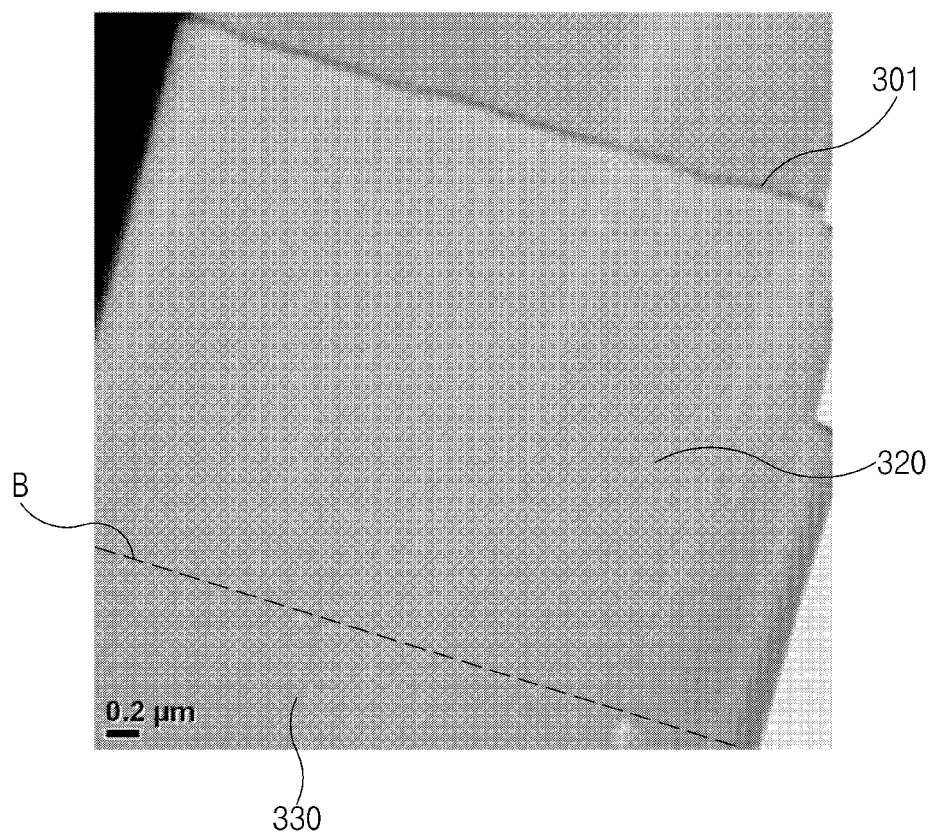
FIG. 6A is a transmission electron microscopy (TEM) image of a housing of an electronic device according to an embodiment of the disclosure.

FIG. 6A is a transmission electron microscopy (TEM) image of a housing of an electronic device according to an embodiment of the disclosure.

Figure 6B:
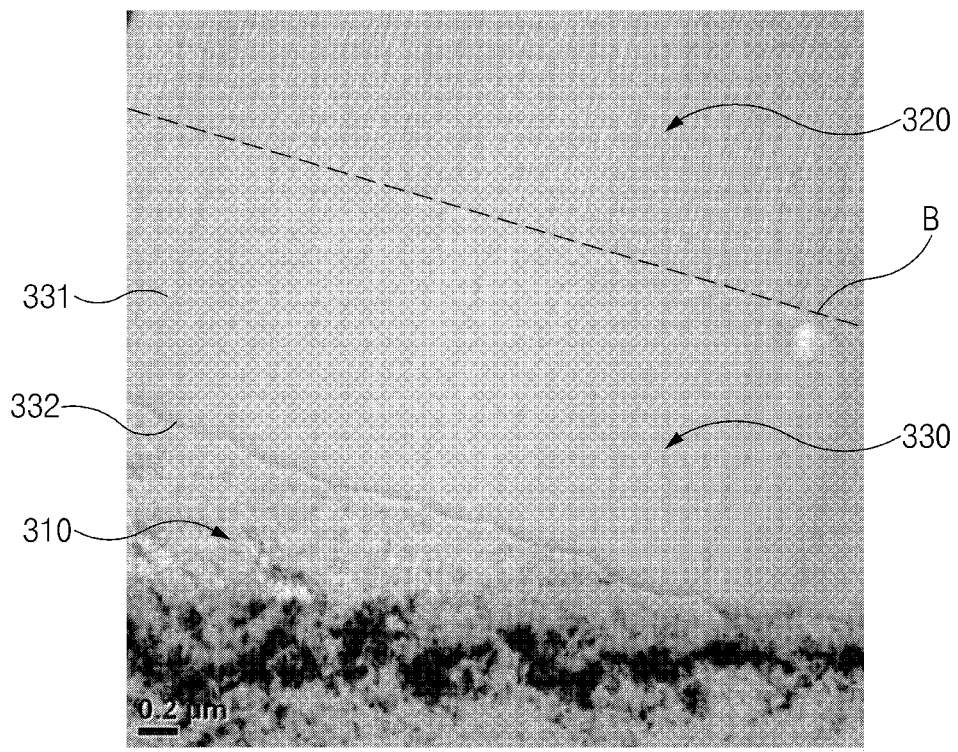
FIG. 6B is a transmission electron microscopy (TEM) image of a housing of an electronic device according to an embodiment of the disclosure.

FIG. 6B is a transmission electron microscopy (TEM) image of a housing of an electronic device according to an embodiment of the disclosure.

Figure 6C:
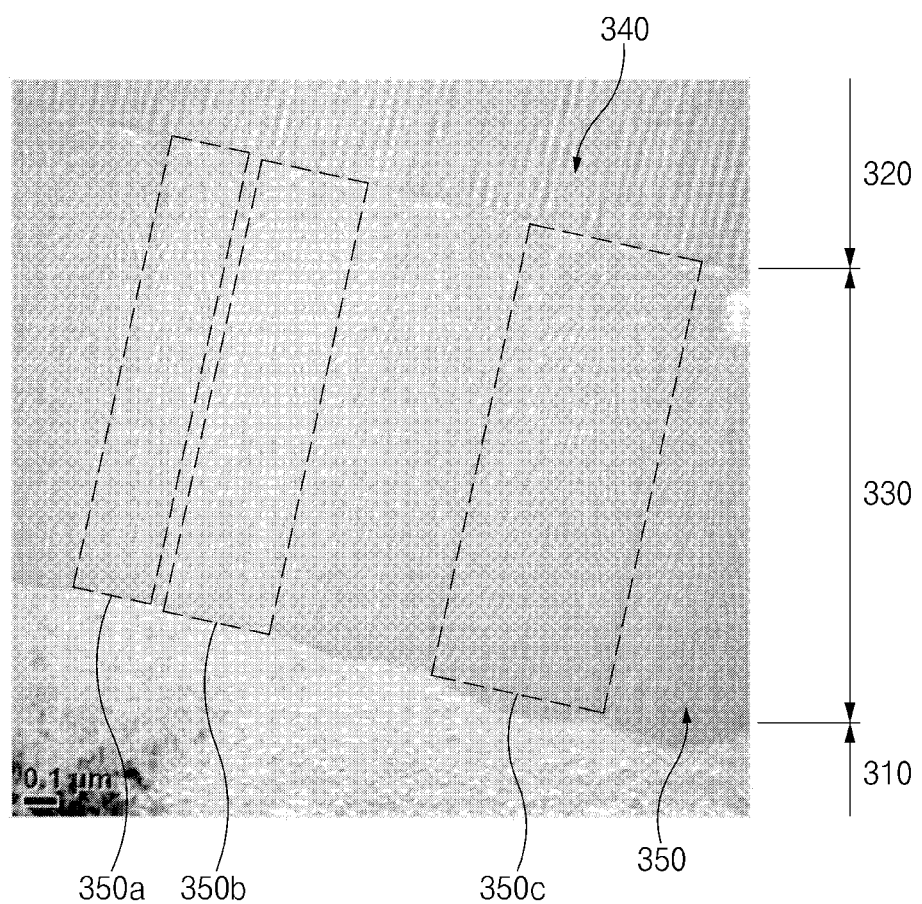
FIG. 6C is a transmission electron microscopy (TEM) image of a housing of an electronic device according to an embodiment of the disclosure.

FIG. 6C is a transmission electron microscopy (TEM) image of a housing of an electronic device according to an embodiment of the disclosure.

Figure 6D:
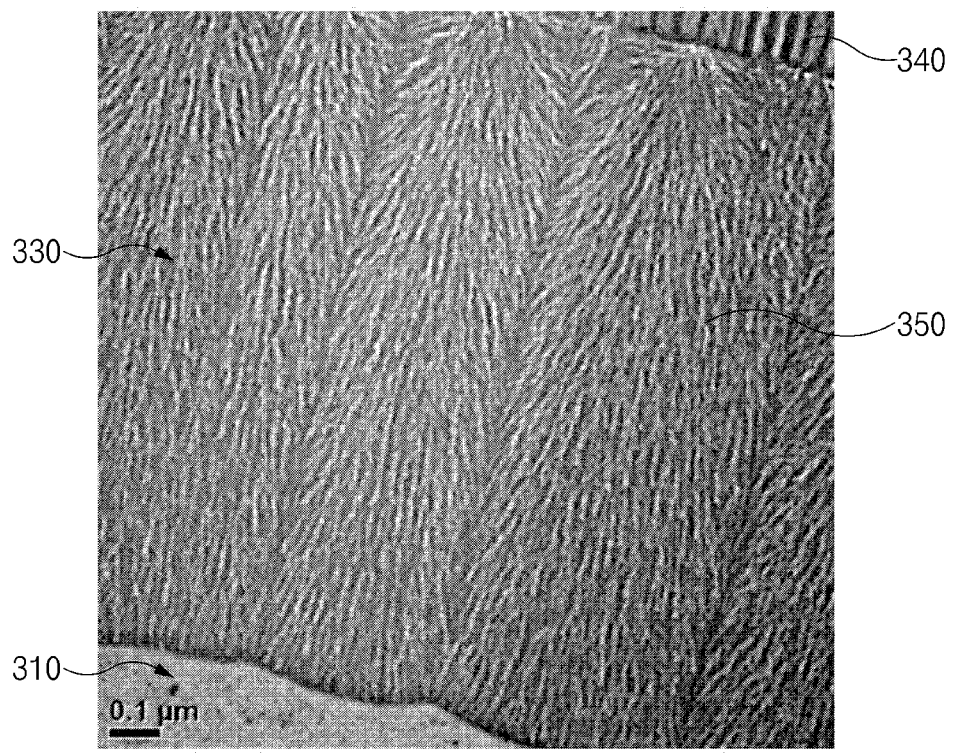
FIG. 6D is a transmission electron microscopy (TEM) image of a housing of an electronic device according to an embodiment of the disclosure.

FIG. 6D is a transmission electron microscopy (TEM) image of a housing of an electronic device according to an embodiment of the disclosure.

Figure 6E:
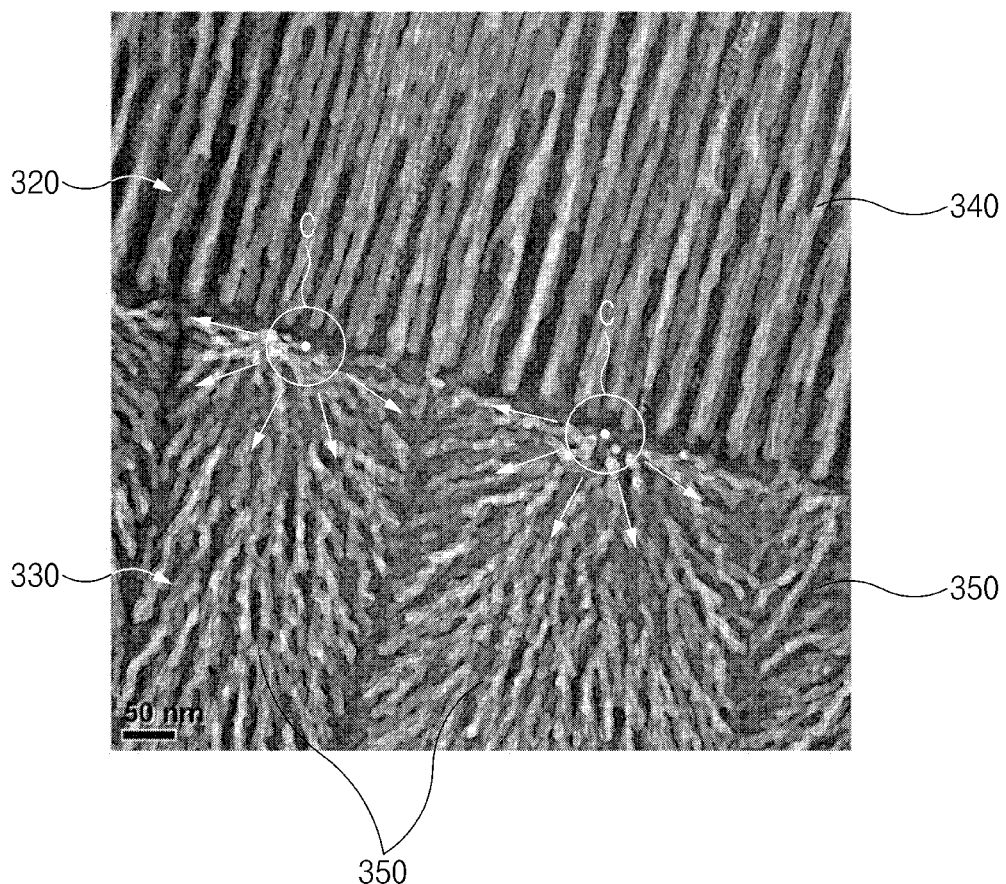
FIG. 6E is a transmission electron microscopy (TEM) image of a housing of an electronic device according to an embodiment of the disclosure.

FIG. 6E is a transmission electron microscopy (TEM) image of a housing of an electronic device according to an embodiment of the disclosure.

FIGS. 6A to 6E are transmission electron microscopy images of a section of the housing.

Referring to FIGS. 6A to 6E, the housing 300 (e.g., the housing 110 of FIGS. 1 and 2 or the housing 200 of FIG. 5) of the electronic device according to an embodiment (e.g., the electronic device 100 of FIGS. 1 to 3) may include a base material layer 310 (e.g., the base material layer 220 of FIG. 5), a first film layer 320 (e.g., the first film layer 230 of FIG. 5), and a second film layer 330 (e.g., the second film layer 240 of FIG. 5). Some of the components of the housing 300 illustrated in FIGS. 6A to 6E may be identical or similar to some of the components of the housing 200 illustrated in FIG. 5. For example, the sectional view illustrated in FIG. 5 may be a schematic view illustrating the sectional images of FIGS. 6A to 6E, and repetitive descriptions will hereinafter be omitted.

In an embodiment, the housing 300 may include a structure in which the base material layer 310 made of a metallic base material, the second film layer 330 formed on a surface of the base material layer 310, and the first film layer 320 formed on a surface of the second film layer 330 are stacked in sequence. The second film layer 330 may include a barrier layer 332 formed on the surface of the base material layer 310 to a predetermined thickness and a porous layer 331 formed on a surface of the barrier layer 332. The thickness of the barrier layer 332 may be smaller than the thickness of the porous layer 331.

In an embodiment, the first film layer 320 may form an outer surface 301 of the housing 300 (e.g., the surface 201 of the first portion 210 of FIG. 5). The first film layer 320 may include a plurality of first pore structures 340 (e.g., the first pore structures 250 of FIG. 5) that extend substantially perpendicular to the outer surface 301 of the housing 300. The plurality of first pore structures 340 may extend to the surface of the second film layer 330.

In an embodiment, the second film layer 330 may include a plurality of second pore structures 350 (e.g., the second pore structures 260 of FIG. 5) that extend as radii from the border B between the first film layer 320 and the second film layer 330. For example, the plurality of second pore structures 350 may extend in various directions toward the base material layer 310 from the border B between the first film layer 320 and the second film layer 330. The plurality of second pore structures 350 may be formed in a form that diverges in various directions toward the base material layer 310 from at least a part of the plurality of first pore structures 340. The plurality of second pore structures 350 may be at least partially connected (or, fluidly communicated) with the plurality of first pore structures 340.

In an embodiment, the plurality of second pore structures 350 may be spaced apart from each other in the porous layer 331 and may be formed to at least partially have different shapes (or, structures). For example, the plurality of second pore structures 350 may not have a standardized shape, but may be irregularly formed such that one portion and another portion have different shapes. Some of the plurality of second pore structures 350 may be formed to have different widths. The widths of the second pore structures 350 may refer to the lengths or widths occupied by the second pore structures 350 in a direction parallel to the outer surface 301 of the housing 300.

In an embodiment, the plurality of second pore structures 350 may include a first group 350a, a second group 350b, and a third group 350c spaced apart from each other. The first group 350a may have a smaller width than the second group 350b, and the second group 350b may have a smaller width than the third group 350c. According to various embodiments of the disclosure, the numbers, densities, sizes (diameters), and/or lengths of pores included in the first group 350a, the second group 350b, and the third group 350c may differ from one another. However, the first group 350a to the third group 350c may correspond to some of the plurality of second pore structures 350 that are arbitrarily specified, and the plurality of second pore structures 350 are not limited to including only the first group 350a to the third group 350c. In an embodiment, each of the plurality of second pore structures 350 may include a plurality of pores extending in different directions. As described above with reference to FIG. 5, a part of the plurality of first pore structures 340 may extend into the second film layer 330, and the extending part may be split into a plurality of branches to form the plurality of pores included in the plurality of second pore structures 350.

For example, referring to FIG. 6E, the second pore structures 350 may be formed in a form in which a plurality of pores extend as radii toward the base material layer 310 with respect to a virtual center area C located at the border B between the first film layer 320 and the second film layer 330.

In an embodiment, the plurality of pores constituting the second pore structures 350 may form an angle of 0 degrees to 90 degrees with respect to the border B between the first film layer 320 and the second film layer 330. For example, some of the plurality of pores may extend in the direction substantially parallel to the border B. Furthermore, other pores may extend in the direction substantially perpendicular to the border B, and the other pores may extend while forming an angle between 0 degrees and 90 degrees.

Figure 7:
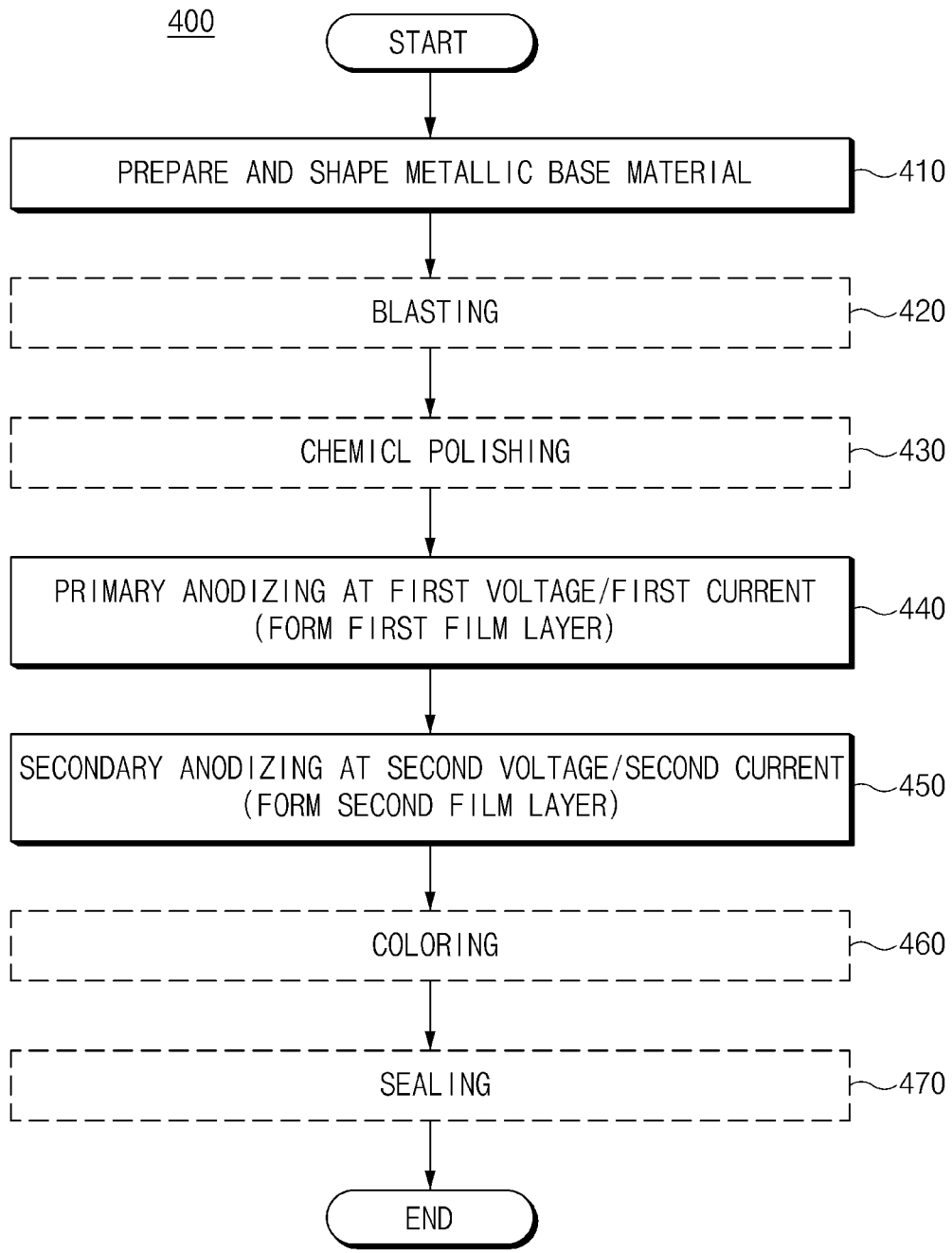
FIG. 7 is a flowchart illustrating a method for manufacturing a housing of an electronic device according to an embodiment of the disclosure.

FIG. 7 is a flowchart illustrating a method for manufacturing a housing of an electronic device according to an embodiment of the disclosure.

Figure 8:
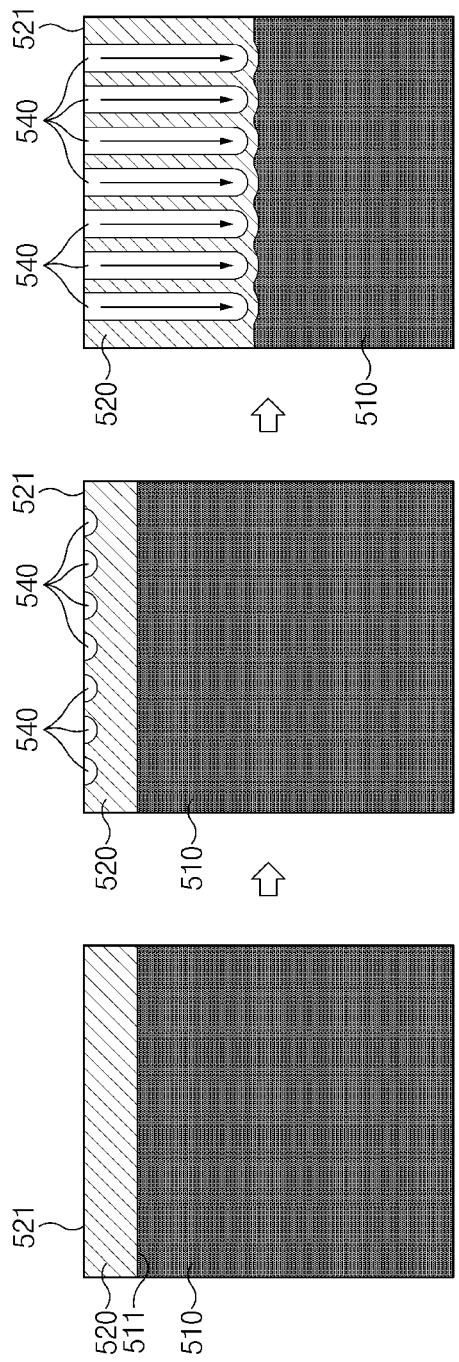
FIG. 8 is a view illustrating a process of manufacturing a housing of an electronic device according to an embodiment of the disclosure.
Figure 8:
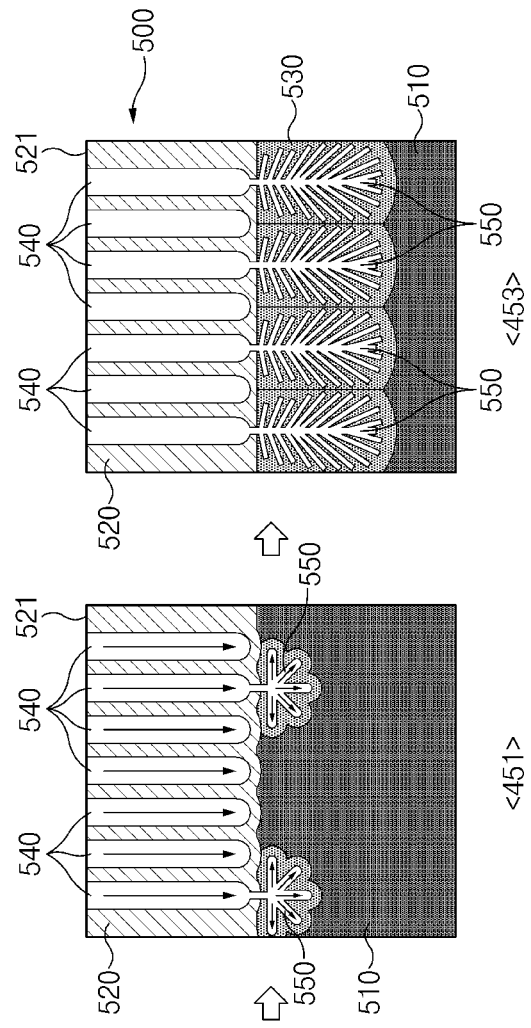

FIG. 8 is a view illustrating a process of manufacturing the housing of the electronic device according to an embodiment of the disclosure.

FIG. 8 illustrates a process of performing a primary anodizing operation and a secondary anodizing operation in the manufacturing method of FIG. 7.

Referring to FIGS. 7 and 8, the method 400 for manufacturing the housing 500 (e.g., the housing 200 of FIG. 5 or the housing 300 of FIGS. 6A to 6E) of the electronic device according to an embodiment may include an operation 410 of preparing and shaping a metallic base material, a blasting operation 420, a chemical polishing operation 430, a primary anodizing operation 440, a secondary anodizing operation 450, a coloring operation 460, and a sealing operation 470.

According to various embodiments of the disclosure, the manufacturing method 400 of the housing 110, 200, or 300 may not include at least some of the aforementioned operations (or, processes). The operations illustrated by dotted lines in the flowchart illustrated in FIG. 7 may be selectively performed according to embodiments. For example, the manufacturing method 400 may not include at least one of the blasting operation 420, the chemical polishing operation 430, the coloring operation 460, or the sealing operation 470.

In the operation 410 of preparing and shaping the metallic base material, the metallic base material 510 may contain at least one of aluminum (Al), titanium (Ti), or magnesium (Mg). For example, the metallic base material 510 may contain an aluminum alloy having a purity of 90% or more. The metallic base material 510 may be manufactured in the form of an extruded member or a plate through an extruding process. According to various embodiments of the disclosure, the metallic base material 510 may be machined in a predetermined shape. For example, the metallic base material 510 may be implemented in a required shape through at least one of pressing, CNC machining, die casting, or extruding.

In the blasting operation 420, the surface roughness of the shaped metallic base material 510 may be adjusted. For example, the blasting operation 420 may be performed by spraying an abrasive (e.g., sand, ceramic beads, or STS) onto a surface of the metallic base material 510 at a high pressure. According to various embodiments of the disclosure, the manufacturing method 400 may further include a physical polishing operation (not illustrated) of physically polishing the metallic base material 510 before the blasting operation 420. The physical polishing operation may include polishing, and the metallic base material 510 may be polished to have a gloss.

In the chemical polishing operation 430, the surface gloss of the blasted metallic base material 510 may be adjusted. The chemical polishing operation 430 may be performed by dipping the metallic base material 510 into a chemical polishing solution. The chemical polishing solution may include an acidic material and/or an alkaline material. In the chemical polishing operation 430, the surface of the metallic base material 510 may be processed into a glossy surface having improved smoothness.

In the anodizing operations 440 and 450, oxide film layers (e.g., a first film layer 520 and a second film layer 530) may be formed on the surface of the metallic base material 510. The anodizing operations 440 and 450 may be performed by dipping the metallic base material 510 into an electrolytic solution and thereafter applying a predetermined range of voltage/current. The anodizing operations 440 and 450 may include the primary anodizing operation 440 and the secondary anodizing operation 450, and the primary anodizing operation 440 and the secondary anodizing operation 450 may differ from each other in terms of voltage/current intensity or voltage/current application time. In various embodiments, the anodizing operations may be performed through a constant-voltage type anodizing process of performing anodizing while maintaining a constant voltage and/or a constant-current type anodizing process of performing anodizing while maintaining a constant current.

For example, the electrolytic solution may include an acidic solution (e.g., sulfuric acid, oxalic acid, chromic acid, or phosphoric acid), an alkaline solution (e.g., sodium hydroxide, sodium carbonate, or ammonium hydroxide), a non-aqueous solution, and/or molten salt bath. However, without being limited thereto, the electrolytic solution may include various types of solutions capable of anodizing the metallic base material 510. The temperature of the solution may range from about 5° C. to about 70° C. The voltage may range from about 5 V to about 100 V. The voltage application time may range from about 5 minutes to about 240 minutes.

In the primary anodizing operation 440, a first oxide film layer (e.g., the first film layer 520) may be formed on the surface of the metallic base material 510. A plurality of first pore structures 540 may be formed in the first film layer 520. The primary anodizing operation 440 may be performed by dipping the metallic base material into a predetermined electrolytic solution and thereafter applying a predetermined range of first voltage/first current. In various embodiments, the first voltage may range from about 15 V to about 25 V, but is not limited thereto.

For example, 441, 443, and 445 of FIG. 8 sequentially illustrate a process in which the first film layer 520 made of metal oxide is formed on a surface 511 of the metallic base material 510 according to the primary anodizing operation 440. Referring to 441 of FIG. 8, the first film layer 520 having a first thickness may be formed on the surface 511 of the metallic base material 510. Referring to <443> of FIG. 8, the plurality of first pore structures 540 may be formed on a surface 521 of the first film layer 520 as the primary anodizing operation 440 is performed. Referring to <445> of FIG. 8, as the primary anodizing operation 440 is continually performed, the first film layer 520 may grow to have a thickness greater than first thickness, and the plurality of first pore structures 540 may extend in a direction perpendicular to the surface 511 of the metallic base material 510 (or, the surface 521 of the first film layer 520).

In the secondary anodizing operation 450, a second oxide film layer (e.g., the second film layer 530) may be formed between the surface of the metallic base material 510 and the first oxide film layer (e.g., the first film layer 520). A plurality of second pore structures 550 may be formed in the second film layer 530. The same electrolytic solution as the electrolytic solution used in the primary anodizing operation 440 may be used in the secondary anodizing operation 450. For example, the secondary anodizing operation 450 may be performed by changing the voltage/current to a second voltage/second current and applying the second voltage/second current after the primary anodizing operation 440 is performed. The second voltage may be lower than the first voltage, and the second current may be lower than the first current. In various embodiments, the second voltage may range from about 8 V to about 10 V, but is not limited thereto.

According to an embodiment of the disclosure, the first film layer 520 and the second film layer 530 may have different pore structures by performing the secondary anodizing operation 450 by changing the voltage/current to a relatively low voltage/current in the state in which the metallic base material is dipped into the same electrolytic solution.

For example, 451 and 453 of FIG. 8 sequentially illustrate a process in which the second film layer 530 is formed according to the secondary anodizing operation 450. Referring to 451 of FIG. 8, as the secondary anodizing operation 450 is performed, at least a part of the plurality of first pore structures 540 may extend as radii toward the metallic base material 510 while the first film layer 520 grows. Referring to 453 of FIG. 8, as the secondary anodizing operation 450 is continually performed, the second film layer 530 may be formed between the first film layer 520 and the metallic base material 510, and the second pore structures 550 extending as radii may be formed in the second film layer 530.

In the coloring operation 460, the first pore structures 540 formed in the first film layer 520 may be filled with a dye for coloring after the secondary anodizing operation 450 is performed. As the coloring operation 460 is performed, the exterior of the housing 500 may be implemented in a predetermined color depending on the dye filling the first pore structures 540. According to various embodiments of the disclosure, the coloring operation 460 may not be performed, and when the first pore structures 540 are not filled with a dye, the exterior of the housing 500 may be implemented in white through scattering of light by the second pore structures 550.

In the sealing operation 470, the first pore structures 540 and the second pore structures 550 may be sealed. The sealing operation 470 may be performed irrespective of whether the coloring operation 460 is performed. The sealing operation 470 may be performed for about 10 minutes to about 240 minutes in a temperature range of about 25° C. to about 110° C. in the state in which the metallic base material 510 subjected to the secondary anodizing operation 450 (or, the metallic base material 510 subjected to the coloring) is dipped into a sealing solution. The corrosion resistance and stain resistance of the housing 500 may be improved by the sealing operation 470.

Figure 9:
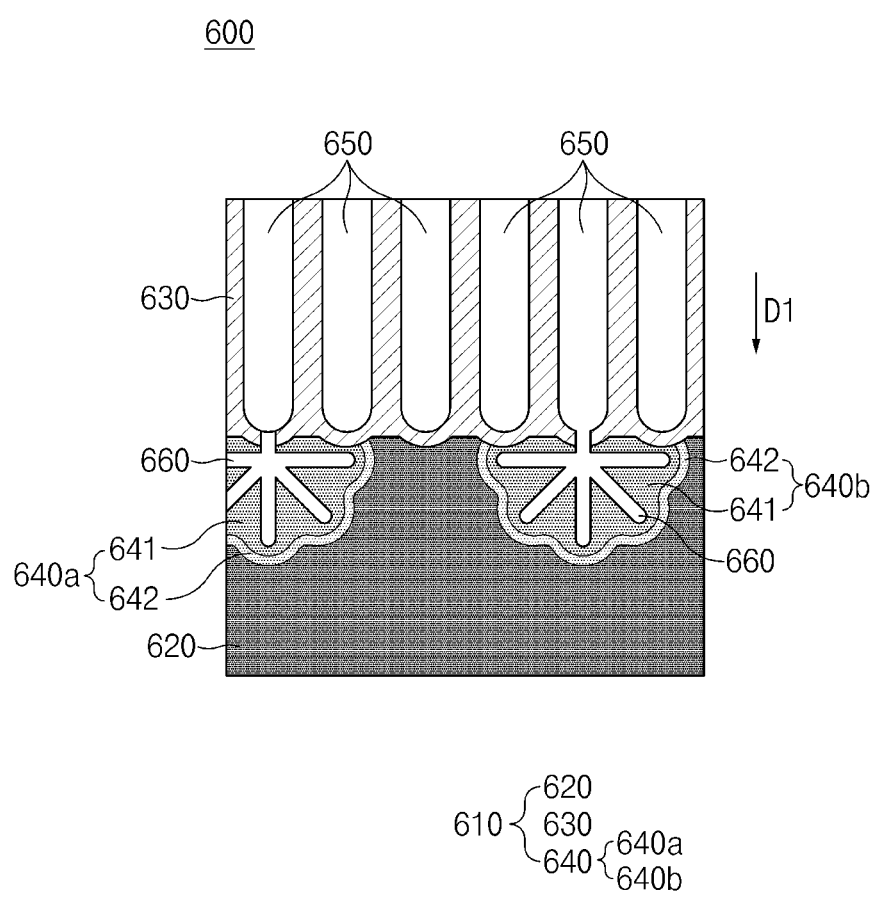
FIG. 9 is a sectional view illustrating a stacked structure of a housing of an electronic device according to an embodiment of the disclosure.

FIG. 9 is a sectional view illustrating a stacked structure of a housing of an electronic device according to an embodiment of the disclosure.

FIG. 9 is a schematic diagram illustrating a section of the housing to describe a stacked structure of a metal portion of the housing.

FIG. 9 may be a view illustrating a section of the housing 600 according to another embodiment that has a different structure from the housing illustrated in FIG. 5 (e.g., the housing 200 of FIG. 5). For example, unlike the housing 200 of FIG. 5, the housing 600 of FIG. 9 may include a second film layer 640 formed in a hemispherical shape.

Components of the housing 600 illustrated in FIG. 9 may be identical or similar to some of the components of the housing 200 illustrated in FIG. 5, and repetitive descriptions will hereinafter be omitted.

Referring to FIG. 9, the housing 600 (e.g., the housing 110 of FIGS. 1 and 2 or the side member 140 of FIGS. 3 and 4) of the electronic device according to an embodiment (e.g., the electronic device 100 of FIGS. 1 to 3) may include a first portion 610 (e.g., the first metal portion 144 of the frame structure 141 of FIG. 4 or the second metal portion 146 of the plate structure 142 of FIG. 4) that contains a metallic material.

In an embodiment, the first portion 610 (e.g., the first portion 210 of FIG. 5) of the housing 600 may include a base material layer 620 (e.g., the base material layer 220 of FIG. 5), a first film layer 630 (e.g., the first film layer 230 of FIG. 5), and the second film layer 640 (e.g., the second film layer 240 of FIG. 5). The first film layer 630 and the second film layer 640 may be oxide films made of oxide of a metallic material. For example, the first film layer 630 and the second film layer 640 may be formed on a surface of the base material layer 620 by oxidation of an area adjacent to a surface of the first portion 610 through an anodizing process.

In an embodiment, the first film layer 630 and the second film layer 640 may be porous film layers having a plurality of pore structures 650 and 660 formed therein. For example, the pore structures 650 formed in the first film layer 630 and the pore structures 660 formed in the second film layer 640 may be formed in different shapes.

In an embodiment, the first film layer 630 may include the plurality of first pore structures 650. The plurality of first pore structures 650 may vertically extend from a surface of the first film layer 630. For example, the plurality of first pore structures 650 may be formed in a straight pore form extending in the first direction D1 perpendicular to the surface of the first film layer 630.

In an embodiment, the second film layer 640 may be located between the base material layer 620 and the first film layer 630. The second film layer 640 may include a porous layer 641 having the plurality of second pore structures 660 formed therein and a barrier layer 642 located between the porous layer 641 and the base material layer 620. For example, the barrier layer 642 may be formed in a shape corresponding to the shape of a surface of the porous layer 641.

In an embodiment, the second film layer 640 may be formed in a hemispherical shape. For example, the second film layer 640 may extend in a substantially hemispherical shape from at least a partial area of the first film layer 630 toward the base material layer 620. As illustrated in FIG. 9, the second film layer 640 may be formed in a substantially semicircular shape when the section of the housing 600 is viewed. For example, the second film layer 640 may be formed in a semicircular shape by convexly extending from the first film layer 630 toward the base material layer 620. For example, the center of a hemispherical film (e.g., the center of a sphere) or the center of a semicircular film (e.g., the center of a circle) may be located adjacent to the first film layer 630. In various embodiments, the center may be located in the first film layer 630, or may be located at the border between the first film layer 630 and the second film layer 640.

In an embodiment, the second film layer 640 may be formed in a hemispherical or semicircular shape and may have a shape in which protrusions and depressions are formed on the surface of the hemisphere or circle. For example, when the second film layer 640 is formed in a hemispherical or semicircular structure, this may mean the entire shape of the second film layer 640 and may be understood as including both the case where the surface of the hemisphere or circle is not smooth and the case where a portion of the surface is recessed.

In an embodiment, the second film layer 640 may include a plurality of hemispherical films 640a and 640b. For example, the second film layer 640 may include the first hemispherical film 640a formed in one partial area of the border between the first film layer 630 and the base material layer 620 and the second hemispherical film 640b formed in another partial area so as to be spaced apart from the first hemispherical film 640a. In various embodiments, the first hemispherical film 640a and the second hemispherical film 640b may be formed in different sizes and/or shapes.

In an embodiment, the second film layer 640 may be discontinuously or continuously formed between the first film layer 630 and the base material layer 620. The second film layer 640 may be formed in at least a partial area between the first film layer 630 and the second film layer 640. For example, the second film layer 640 may be discontinuously formed by being located in only a partial area of the border area between the first film layer 630 and the base material layer 620 (refer to FIG. 10). As illustrated in FIG. 9, the first hemispherical film 640a and the second hemispherical film 640b may be spaced apart from each other in the direction perpendicular to the first direction D1, and the base material layer 620 may be located between the first hemispherical film 640a and the second hemispherical film 640b. However, without being limited to the illustrated embodiment, the second film layer 640 may be formed in a form in which the plurality of hemispherical films 640a and 640b are continuously connected (e.g., refer to FIG. 11) and may thus be located in the entire area between the first film layer 630 and the base material layer 620.

In an embodiment, the second film layer 640 may include the plurality of second pore structures 660 formed in at least part of the porous layer 641. The plurality of second pore structures 660 may extend toward the base material layer 620 to correspond to the form of the second film layer 640 formed in a hemispherical shape and may be at least partially fluidly connected with the plurality of first pore structures 650. For example, the plurality of second pore structures 660 may extend from at least parts of the plurality of first pore structures 650. In various embodiments, the plurality of second pore structures 660 may extend as radii toward the base material layer 620 from the border between the first film layer 630 and the second film layer 640. For example, the plurality of second pore structures 660 may be formed in a form extending as radii toward the base material layer 620 from the center of the hemisphere (or, the center of the semicircle) of the second film layer 640 (e.g., the hemispherical films 640a and 640b).

In an embodiment, the housing 600 including the second film layer 640 having a hemispherical or semicircular shape may be manufactured by differently adjusting some conditions of the anodizing operation (e.g., the primary anodizing operation 440 or the secondary anodizing operation 450 of FIG. 7) in the manufacturing method illustrated in FIG. 7 (e.g., in the method 400 of FIG. 7).

Referring to the flowchart of FIG. 7 (e.g., the manufacturing method 400 of FIG. 7), the first film layer 630 including the first pore structures 650 may be formed through the primary anodizing operation (e.g., the primary anodizing operation 440 of FIG. 7), and the primary anodizing operation 440 may be performed at the first voltage/first current. The second film layer 640 formed in a hemispherical or semicircular film structure may be formed through the secondary anodizing operation (e.g., the primary anodizing operation 450 of FIG. 7). The secondary anodizing operation 450 may use the same electrolytic solution as the electrolytic solution used in the primary anodizing operation 440 and may be performed at the second voltage/second current lower than the first voltage/first current. For example, the secondary anodizing operation 450 may be performed by lowering the voltage/current from the first voltage/first current to the second voltage/second current and applying the second voltage/second current after the primary anodizing operation 440 is performed.

According to various embodiments of the disclosure, the second film layer 640 of the housing 600 of FIG. 9 may have a smaller thickness than the second film layer (e.g., the second film layer 240 of FIG. 5) of the housing illustrated in FIG. 5 (e.g., the housing 200 of FIG. 5). In various embodiments, the thickness of a film layer formed through an anodizing operation may increase with an increase in time during which a voltage/current is applied. For example, the process time of the secondary anodizing operation (e.g., the secondary anodizing operation 450 of FIG. 7) (or, the time during which the voltage/current is applied) in the manufacturing method of the housing 600 of FIG. 9 may be shorter than that in the manufacturing method of the housing 200 of FIG. 5.

Referring to the anodizing operations illustrated in FIG. 8, the housing 600 according to the embodiment of FIG. 9 may be manufactured through the process of FIG. 8. In various embodiments, the housing 600 of FIG. 9 may be manufactured as the anodizing operations (e.g., the primary anodizing operation 440 and the secondary anodizing operation 450 of FIG. 7) are performed to the states illustrated in 441, 443, 445, and 451 of FIG. 8. For example, the first film layer 630 may be formed through the primary anodizing operation 440 illustrated in 441, 443, and 445 of FIG. 8, and the second film layer 640 may be formed through the secondary anodizing operation 450 illustrated in 451 of FIG. 8. In another example, the stacked structure of the housing illustrated in FIG. 5 (e.g., the housing 200 of FIG. 5) may be implemented by lengthening the process time of the secondary anodizing process 450 in the manufacturing process of the housing 600 according to the embodiment of FIG. 9. However, the above-described manufacturing method is illustrative, and the disclosure is not necessarily limited thereto.

In an embodiment, the housing 600 may include the second film layer 640 having a hemispherical (or, semicircular) shape and may thus appear to have dual or multiple colors (e.g., a multi-color) in appearance due to scattering and interference of light. For example, light incident on the housing 600 may be repeatedly reflected by the second film layer 640 having a hemispherical shape, and scattering and interference of the reflected light may occur.

According to an embodiment, a multi-color (e.g., a ceramic color) may be implemented by forming the second hemispherical (or, semicircular) film layer 640 for scattering and interference of light on the housing 600 through an anodizing process. For example, when a dye is not applied to the first film layer 630 and the second film layer 640, a multi-color may be implemented by addition of light scattering and interference effects by the second film layer 640 to the color of the first film layer 630 (e.g., a metallic color or a gray-based or brown-based color). For example, when a dye is applied to the first film layer 630 and/or the second film layer 640, a multi-color may be implemented by addition of the color of the dye and light scattering and interference effects.

Figure 10:
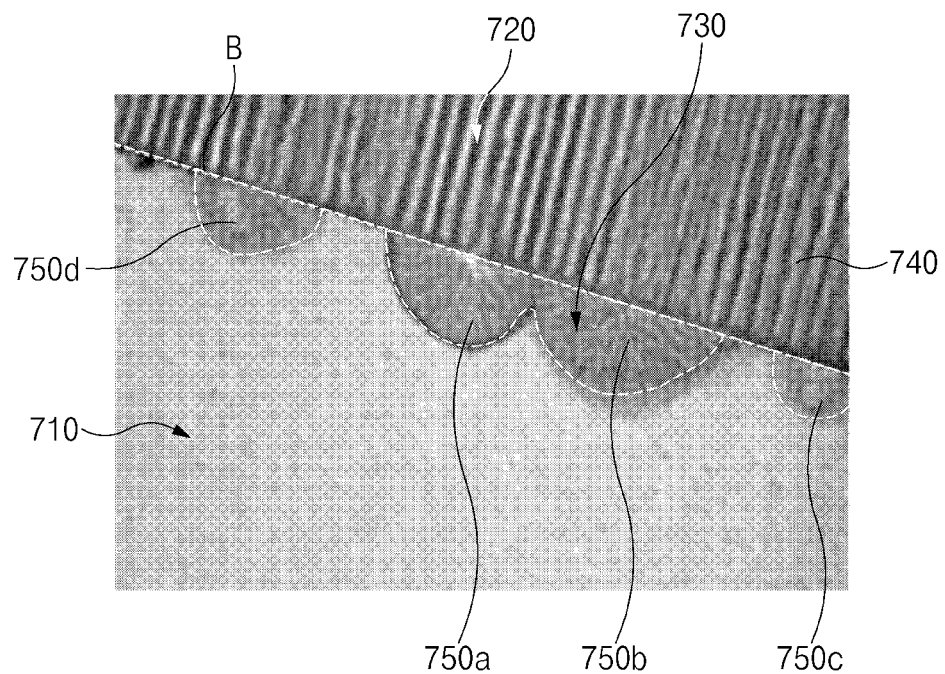
FIG. 10 is a transmission electron microscopy (TEM) image of a housing of an electronic device according to an embodiment of the disclosure.

FIG. 10 is a transmission electron microscopy (TEM) image of a housing of an electronic device according to an embodiment of the disclosure.

Figure 11:
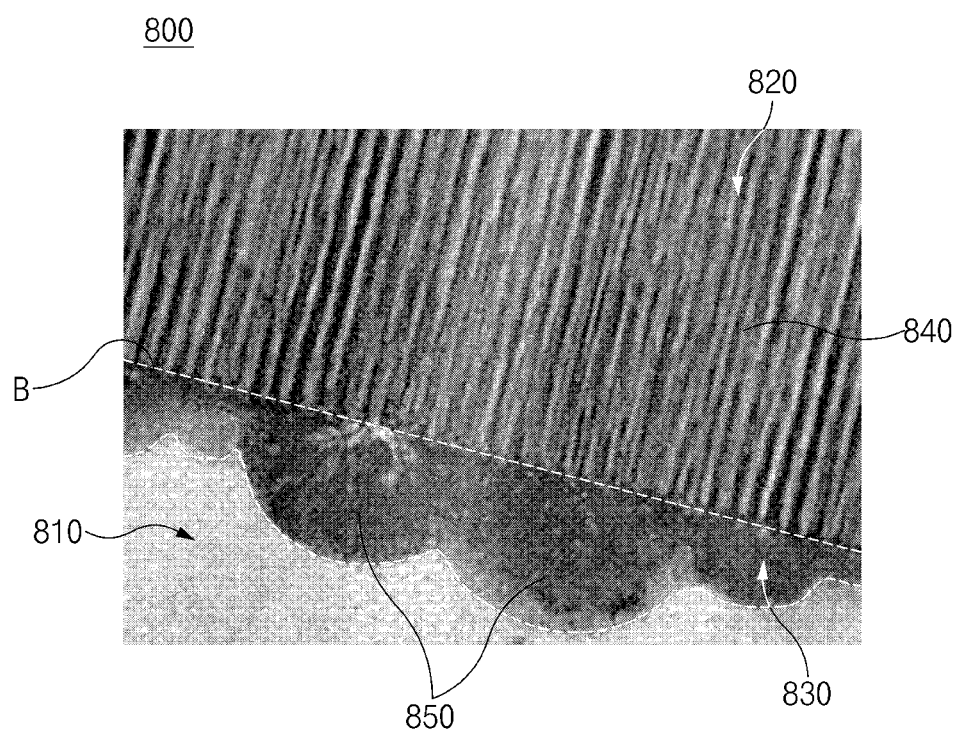
FIG. 11 is a transmission electron microscopy (TEM) image of a housing of an electronic device according to an embodiment of the disclosure.

FIG. 11 is a transmission electron microscopy (TEM) image of a housing of an electronic device according to an embodiment of the disclosure.

FIGS. 10 and 11 are transmission electron microscopy images of sections of the housings according to embodiments different from the housings described above with reference to FIGS. 5, 6A, 6B, 6C, 6D, 6E, 7, and 8.

For example, the housing 700 of FIG. 10 and the housing 800 of FIG. 11 may each include a different form of pore structure from the housings of FIGS. 5, 6A, 6B, 6C, 6D, 6E, 7, and 8. For example, the sectional view illustrated in FIG. 9 may be a schematic view illustrating the sectional images of FIGS. 10 and 11.

Referring to FIG. 10, the housing 700 (e.g., the housing 600 of FIG. 9) of the electronic device according to an embodiment (e.g., the electronic device 100 of FIGS. 1 to 3) may include a base material layer 710 (e.g., the base material layer 620 of FIG. 9), a first film layer 720 (e.g., the first film layer 630 of FIG. 9), and a second film layer 730 (e.g., the second film layer 640 of FIG. 9).

Some of the components of the housing 700 illustrated in FIG. 10 may be identical or similar to some of the components of the housings 200, 300, 500, and 600 illustrated in FIGS. 5, 6A, 6B, 6C, 6D, 6E, 7, 8, and 9, and repetitive descriptions will hereinafter be omitted.

In an embodiment, the housing 700 may include the base material layer 710 made of a metallic base material and the oxide film layers (e.g., the first film layer 720 and the second film layer 730) formed on the base material layer 710. The oxide film layers 720 and 730 may include the first film layer 720 disposed adjacent to the outer surface of the housing 700 and the second film layer 730 disposed between the first film layer 720 and the base material layer 710. For example, the first film layer 720 and the second film layer 730 may be porous layers having a plurality of fine pores formed therein.

In an embodiment, the first film layer 720 may include a plurality of first pore structures 740 (e.g., the first pore structures 250 of FIG. 5 or the first pore structures 650 of FIG. 9) extending in a direction substantially perpendicular to the outer surface of the housing 700. For example, the first film layer 720 may be continuously formed in a direction parallel to the outer surface of the housing 700 (or, a direction parallel to the border B between the first film layer 720 and the second film layer 730).

In an embodiment, the second film layer 730 may extend in a hemispherical shape from at least part of the first film layer 720 toward the base material layer 710. For example, when the section of the housing 700 is viewed, the second film layer 730 may be formed in a semicircular shape convexly extending toward the base material layer 710 from at least part of the border B between the first film layer 720 and the second film layer 730. The second film layer 730 may include a plurality of hemispherical films having different sizes and/or shapes.

In various embodiments, a plurality of second pore structures (not illustrated) (e.g., the second pore structures 660 of FIG. 9) having a different structure from the plurality of first pore structures 740 may be formed in the second film layer 730. For example, the plurality of second pore structures 660 may extend in various directions toward the base material layer 710 from the border B between the first film layer 720 and the second film layer 730 and may be at least partially connected (or, fluidly communicated) with the plurality of first pore structures 740.

In an embodiment, the second film layer 730 may be discontinuously formed in the direction parallel to the outer surface of the housing 700 (or, the direction parallel to the border B between the first film layer 720 and the second film layer 730). For example, the second film layer 730 may be formed in a form in which some of a plurality of hemispherical films 750a, 750b, 750c, and 750d (e.g., the hemispherical films 640a and 640b of FIG. 9) are spaced apart from the others.

According to the embodiment illustrated in FIG. 10, the second film layer 730 may be formed by the plurality of hemispherical films 750a, 750b, 750c, and 750d including the first hemispherical film 750a, the second hemispherical film 750b, the third hemispherical film 750c, and the fourth hemispherical film 750d. The first hemispherical film 750a, the second hemispherical film 750b, the third hemispherical film 750c, and the fourth hemispherical film 750d may correspond to some of the plurality of hemispherical films that are arbitrarily specified, and the plurality of hemispherical films forming the second film layer 730 are not limited to including only the first hemispherical film 750a, the second hemispherical film 750b, the third hemispherical film 750c, and the fourth hemispherical film 750d.

For example, the first hemispherical film 750a and the second hemispherical film 750b may be continuously formed so as to be connected with each other, and each of the third hemispherical film 750c and the fourth hemispherical film 750d may be formed to be spaced apart from the first hemispherical film 750a and/or the second hemispherical film 750b at a predetermined interval in the direction parallel to the border B. At least part of the base material layer 710 may be located between the first hemispherical film 750a and the fourth hemispherical film 750d or between the second hemispherical film 750b and the third hemispherical film 750c. For example, the second film layer 730 may not be formed between a partial area of the first film layer 720 and a partial area of the base material layer 710. In another example, one portion of the first film layer 720 may be formed on a surface of the second film layer 730, and another portion of the first film layer 720 may be formed on a surface of the base material layer 710.

Referring to FIG. 11, the housing 800 (e.g., the housing 700 of FIG. 10) of the electronic device according to an embodiment (e.g., the electronic device 100 of FIGS. 1 to 3) may be configured such that a second film layer 830 (e.g., the second film layer 730 of FIG. 10) is continuously formed.

In an embodiment, the housing 800 (e.g., the housing 600 of FIG. 9) may include a base material layer 810 (e.g., the base material layer 620 of FIG. 9), a first film layer 820 (e.g., the first film layer 630 of FIG. 9), and the second film layer 830 (e.g., the second film layer 640 of FIG. 9).

In an embodiment, the first film layer 820 may include a plurality of first pore structures 840 (e.g., the first pore structures 740 of FIG. 10) that extend in a direction substantially perpendicular to an outer surface of the housing 800. For example, the first film layer 820 may be continuously formed in a direction parallel to the outer surface of the housing 800 (or, a direction parallel to the border B between the first film layer 820 and the second film layer 830).

In an embodiment, the second film layer 830 may be continuously formed in the direction parallel to the outer surface of the housing 800 (or, the direction parallel to the border B between the first film layer 820 and the second film layer 830). For example, unlike the housing 700 of FIG. 10, the housing 800 of FIG. 11 may be configured such that the second film layer 830 is formed by a plurality of hemispherical films 850 connected with each other.

According to the embodiment illustrated in FIG. 11, the second film layer 830 may be continuously formed by connection of the plurality of hemispherical films 850 having different sizes and/or shapes. For example, the thickness of the second film layer 830 may vary along the direction parallel to the border B between the first film layer 820 and the second film layer 830.

In an embodiment, the second film layers 730 and 830 illustrated in FIGS. 10 and 11 may be formed by adjusting delay time in the secondary anodizing operation. Referring to the flowchart of FIG. 7 (e.g., the manufacturing method 400 of FIG. 7), the first film layers 720 and 820 having straight pores (the first pore structures 740 and 840) may be formed through the primary anodizing operation (e.g., the primary anodizing operation 440 of FIG. 7), and the primary anodizing operation 440 may be performed at the first voltage/first current. The second film layers 730 and 830 having a hemispherical shape may be formed through the secondary anodizing operation (e.g., the primary anodizing operation 450 of FIG. 7), and the secondary anodizing operation 450 may be performed at the second voltage/second current lower than the first voltage/first current for a specified period of time. For example, the secondary anodizing operation 450 may be performed by performing the primary anodizing operation 440 at the first voltage/first current, lowering the voltage/current to the second voltage/second current, and maintaining the state in which the second voltage/second current is applied for a predetermined period of time or more.

As described above with reference to FIG. 9, the housings 700 and 800 according to an embodiment (e.g., the housing 600 of FIG. 9) may be configured such that scattering and interference of light incident on the housings 700 and 800 occur due to the second film layers 730 and 830 including the plurality of hemispherical films. For example, the housings 700 and 800 may have a coloring effect due to scattering and interference of light. In various embodiments, when the first film layers 720 and 820 and/or the second film layers 730 and 830 are filled with a dye, a color due to interference of light may be added to the color of the dye, and the exteriors of the housings 700 and 800 may appear to have a color (e.g., a multi-color) in which the color of the dye and the color due to the light interference are combined.

An electronic device 100 according to an embodiment of the disclosure may include a housing 110 or 200 that forms a portion of an outer surface of the electronic device 100 and a display 130 disposed in the housing 110 or 200 and visually exposed through one side of the housing 110 or 200. The housing may include a first portion 210 containing a metallic material, and the first portion 210 may include a base material layer 220 made of the metallic material, a first film layer 230 that is disposed adjacent to a surface of the housing and that contains oxide of the metallic material, and a second film layer 240 that is disposed between the base material layer 220 and the first film layer 230 and that contains oxide of the metallic material. The first film layer 230 may include a first pore structure 250 that extends in a direction substantially perpendicular to a surface of the first film layer 230, and the second film layer 240 may include a second pore structure 260 that is at least partially fluidly communicated with the first pore structure 250 and that extends as radii toward the base material layer 220.

In various embodiments, the first pore structure 250 may extend from at least a partial area of the surface of the first film layer 230 to a surface of the second film layer 240 in a first direction D1, and the first direction D1 may be a direction substantially perpendicular to the surface of the first film layer 230.

In various embodiments, the second pore structure 260 may be connected with one end of the first pore structure 250 to be in fluid communication with the first pore structure 250.

In various embodiments, the second pore structure 260 may include a plurality of pores, and at least some of the plurality of pores may obliquely extend to form a predetermined angle with a surface of the second film layer 240.

In various embodiments, the second pore structure 260 may include a plurality of pores, and at least some of the plurality of pores may extend in a direction substantially perpendicular to a surface of the second film layer 240.

In various embodiments, the second pore structure 260 may include a plurality of inclined pores 262 that extend in a direction forming a predetermined range of angle with the first direction.

In various embodiments, the second pore structure 260 may further include a vertical pore 261 that extends from at least a portion of the surface of the second film layer 240 in the first direction D1, and the plurality of inclined pores 262 may extend from partial areas of the vertical pore 261 in directions different from the first direction D1.

In various embodiments, the plurality of inclined pores 262 may diverge from the vertical pore 261 in different directions.

In various embodiments, at least some of the plurality of inclined pores 262 may form a predetermined included angle with the vertical pore 261, and the included angle may be 90 degrees or less.

In various embodiments, the first film layer 230 may be formed on a surface of the second film layer 240 and may form at least a portion of the surface of the housing 110 or 200.

In various embodiments, the second film layer 240 may include a porous layer 241 having the second pore structure 260 formed therein and a barrier layer 242 formed between the porous layer 241 and the base material layer 220.

In various embodiments, the second film layer 240 may be formed in a hemispherical shape convex from the first film layer 230 toward the base material layer 220.

In various embodiments, at least a portion of the first pore structure 250 or at least a portion of the second pore structure 260 may be configured such that a dye is disposed therein.

In various embodiments, the housing 110 or 200 may further include a cut-off portion 143 that at least partially insulates the first portion 210, and at least part of the first portion 210 may form an antenna structure of the electronic device.

An electronic device 100 according to an embodiment of the disclosure may include a housing 110 or 200 including a front plate 120, a back plate 180 that faces away from the front plate 120, and a side member 140 that surrounds an inner space between the front plate 120 and the back plate 180 and a display 130 disposed in the inner space and visually exposed through the front plate 120. The side member 140 may include a first portion 210 containing a metallic material, and the first portion 210 may include a base material layer 220 made of the metallic material, a first film layer 230 disposed adjacent to a surface of the side member and made of oxide of the metallic material, and a second film layer 240 disposed between the base material layer 220 and the first film layer 230 and made of oxide of the metallic material. The first film layer 230 may include a plurality of first pore structures 250 that extend in a direction substantially perpendicular to a surface of the first film layer 230. The second film layer 240 may include a plurality of second pore structures 260 at least partially fluidly communicated with the first pore structures 250, and the second pore structures 260 may extend as radii toward the base material layer 220.

In various embodiments, the side member 140 may include a frame structure 141 that forms an outer surface of the electronic device 100 together with the front plate 120 and the back plate 180 and a plate structure 142 that extends from the frame structure 141 toward the inner space. The frame structure 141 may include the first portion 210 and a cut-off portion 143 that insulates one part of the first portion 210 and another part thereof. At least part of the first portion 210 may be configured to function as an antenna of the electronic device by being insulated by the cut-off portion 143.

In various embodiments, the first pore structures 250 may extend from at least partial areas of the surface of the first film layer 230 to a surface of the second film layer 240 in the direction perpendicular to the surface of the first film layer 230.

In various embodiments, the second pore structures 260 may include a vertical structure (i.e., vertical pore 261) that extends in a direction substantially perpendicular to a surface of the second film layer 240 and an inclined structure (i.e., inclined pores 262) that obliquely extends to form a predetermined angle with the surface of the second film layer.

A method 400 for manufacturing a metal housing 110 or 200 according to an embodiment of the disclosure may include an operation 410 of preparing a metallic base material, an operation 440 of performing primary anodizing on the metallic base material in a predetermined electrolytic solution with a first voltage or a first current, and an operation 450 of performing secondary anodizing on the metallic base material in the predetermined electrolytic solution with a second voltage or a second current less than the first voltage or the first current. In the primary anodizing operation 440, a first film layer 230 including a plurality of first pore structures 250 may be formed on a surface of the metallic base material, and in the secondary anodizing operation 450, a second film layer 240 including a plurality of second pore structures 260 may be formed between the surface of the metallic base material and the first film layer 230. The first pore structures 250 and the second pore structures 260 may have different structures (i.e., different shapes).

In various embodiments, the first pore structures 250 may extend in a first direction substantially perpendicular to a surface of the first film layer 230, and the second pore structures 260 may extend as radii from a surface of the second film layer 240 toward the surface of the metallic base material.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software including one or more instructions that are stored in a storage medium that is readable by a machine (e.g., the electronic device 100). For example, a processor of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a housing configured to form a portion of an outer surface of the electronic device; and
   a display disposed in the housing and visually exposed through one side of the housing,
   wherein the housing comprises a first portion containing a metallic material,
   wherein the first portion comprises:
      a base material layer made of the metallic material,
      a first film layer disposed adjacent to a surface of the housing, the first film layer containing oxide of the metallic material, and
      a second film layer disposed between the base material layer and the first film layer, the second film layer containing oxide of the metallic material,
   wherein the first film layer comprises a first pore structure configured to extend in a first direction substantially perpendicular to a surface of the first film layer,
   wherein the second film layer comprises a second pore structure at least partially in fluid communication with the first pore structure,
   wherein the second pore structure comprises a central pore extending from the first pore structure toward the base material layer with a width smaller than the first pore structure and a plurality of inclined pores extending from the central pore downward toward the base material layer, and
   wherein each of the plurality of inclined pores is in at least partial fluid communication with the first pore structure through the central pore.

2. The electronic device of claim 1,
   wherein the first pore structure extends from at least a partial area of the surface of the first film layer to a surface of the second film layer in the first direction.

3. The electronic device of claim 1, wherein the second pore structure is connected with one end of the first pore structure to be in fluid communication with the first pore structure.

4. The electronic device of claim 1,
   wherein at least some of the plurality of inclined pores obliquely extend to form a predetermined angle with a surface of the second film layer.

5. The electronic device of claim 1,
   wherein the second pore structure comprises a plurality of central pores, and
   wherein at least some of the central pores extend in a direction substantially perpendicular to a surface of the second film layer.

6. The electronic device of claim 2, wherein the plurality of inclined pores is configured to extend in a direction forming a predetermined range of angle with the first direction.

7. The electronic device of claim 6,
   wherein the central pore is configured to extend from at least a portion of the surface of the second film layer in the first direction, and
   wherein the plurality of inclined pores extends from partial areas of the central pore in directions different from the first direction.

8. The electronic device of claim 7, wherein the plurality of inclined pores diverges from the central pore in different directions.

9. The electronic device of claim 7, wherein at least some of the plurality of inclined pores form a predetermined included angle with the central pore, and the predetermined included angle is less than 90 degrees.

10. The electronic device of claim 1, wherein the first film layer is formed on a surface of the second film layer and forms at least a portion of the surface of the housing.

11. The electronic device of claim 1, wherein the second film layer comprises a porous layer having the second pore structure formed therein and a barrier layer formed between the porous layer and the base material layer.

12. The electronic device of claim 1, wherein the second film layer is formed in a hemispherical shape convex from the first film layer toward the base material layer.

13. The electronic device of claim 1, wherein at least a portion of the first pore structure or at least a portion of the second pore structure is configured such that a dye is disposed therein.

14. The electronic device of claim 1,
   wherein the housing further comprises a cut-off portion configured to at least partially insulate the first portion, and
   wherein at least part of the first portion forms an antenna structure of the electronic device.

15. A method for manufacturing a metal housing, the method comprising:
   preparing a metallic base material;
   performing primary anodizing on the metallic base material in a predetermined electrolytic solution with a first voltage or a first current; and
   performing secondary anodizing on the metallic base material in the predetermined electrolytic solution with a second voltage or a second current less than the first voltage or the first current,
   wherein in the primary anodizing operation, a first film layer comprising a plurality of first pore structures is formed on a surface of the metallic base material,
   wherein each first pore structure of the plurality of first pore structures extends in a direction substantially perpendicular to a surface of the first film layer,
   wherein in the secondary anodizing operation, a second film layer comprising a plurality of second pore structures is formed between the surface of the metallic base material and the first film layer,
   wherein each second pore structure of the plurality of second pore structures is at least partially in fluid communication with a corresponding first pore structure of the plurality of first pore structures,
   wherein each second pore structure of the plurality of second pore structures comprises a central pore extending from each first pore structure of the plurality of first pore structures toward the metallic base material with a width smaller than each corresponding first pore structure of the plurality of first pore structures and a plurality of inclined pores extending from the central pore downward toward the metallic base material, and wherein each of the plurality of inclined pores is in at least partial fluid communication with the corresponding first pore structure of the plurality of first pore structures through the central pore.

* * * * *